(12) United States Patent
Yoshida et al.

(10) Patent No.: US 12,062,654 B2
(45) Date of Patent: Aug. 13, 2024

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Takuya Yoshida, Fukuoka (JP); Kenji Suzuki, Tokyo (JP); Yuki Haraguchi, Tokyo (JP); Hidenori Koketsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/409,053

(22) Filed: Aug. 23, 2021

(65) Prior Publication Data

US 2022/0173094 A1    Jun. 2, 2022

(30) Foreign Application Priority Data

Nov. 27, 2020 (JP) .................................. 2020-197165

(51) Int. Cl.
*H01L 27/06* (2006.01)
*H01L 21/765* (2006.01)
(Continued)

(52) U.S. Cl.
CPC ........ *H01L 27/0664* (2013.01); *H01L 21/765* (2013.01); *H01L 29/407* (2013.01);
(Continued)

(58) Field of Classification Search
CPC ............. H01L 29/7813; H01L 29/7397; H01L 29/66734; H01L 29/66613;
(Continued)

(56) References Cited

U.S. PATENT DOCUMENTS

2010/0156506 A1\*  6/2010  Tsuzuki ............. H01L 27/0664
                                                        257/140
2011/0316074 A1    12/2011  Oota
(Continued)

FOREIGN PATENT DOCUMENTS

JP    2010-093026 A    4/2010
JP    2012-009671 A    1/2012
(Continued)

OTHER PUBLICATIONS

An Office Action; "Notice of Reasons for Refusal," mailed by the Japanese Patent Office on Nov. 28, 2023, which corresponds to Japanese Patent Application No. 2020-197165 and is related to U.S. Appl. No. 17/409,053; with English language translation.

*Primary Examiner* — Jesse Y Miyoshi
(74) *Attorney, Agent, or Firm* — Studebaker & Brackett PC

(57) ABSTRACT

A semiconductor device includes a semiconductor substrate, a first semiconductor layer of a first conductivity type, a second semiconductor layer of a second conductivity type, a diode trench gate, and an electrode layer. The first semiconductor layer is provided as a surface layer on the upper surface side of the semiconductor substrate. The second semiconductor layer is provided below the first semiconductor layer. The diode trench gate includes a diode trench insulation film formed along, out of the inner wall of the trench, a lower side wall and a bottom that are located below an upper side wall located on the upper end side of the trench. The diode trench gate includes a diode trench electrode provided inside the trench. The electrode layer covers the upper side wall of the trench. The first semiconductor layer is in contact with the electrode layer on the upper side wall of the trench.

8 Claims, 40 Drawing Sheets

(51) Int. Cl.
*H01L 29/40* (2006.01)
*H01L 29/66* (2006.01)
*H01L 29/739* (2006.01)
*H01L 29/861* (2006.01)

(52) U.S. Cl.
CPC .. *H01L 29/66136* (2013.01); *H01L 29/66348* (2013.01); *H01L 29/7397* (2013.01); *H01L 29/8613* (2013.01)

(58) Field of Classification Search
CPC ......... H01L 29/66621; H01L 29/66628; H01L 29/4236; H01L 29/7803; H01L 29/7804; H01L 29/7805; H01L 29/7808; H01L 29/7395

See application file for complete search history.

(56) References Cited

U.S. PATENT DOCUMENTS

| | | |
|---|---|---|
| 2015/0380536 A1 | 12/2015 | Kimura et al. |
| 2016/0141400 A1 | 5/2016 | Takahashi |
| 2016/0260810 A1 | 9/2016 | Sakai |
| 2018/0114857 A1 | 4/2018 | Okada et al. |
| 2020/0098905 A1* | 3/2020 | Naito ................ H01L 29/41708 |

FOREIGN PATENT DOCUMENTS

| | | |
|---|---|---|
| JP | 2016-096222 A | 5/2016 |
| JP | 2016-162975 A | 9/2016 |
| WO | 2014/125583 A1 | 8/2014 |
| WO | 2016/175152 A1 | 11/2016 |
| WO | 2019/117248 A1 | 6/2019 |

* cited by examiner

F I G. 2
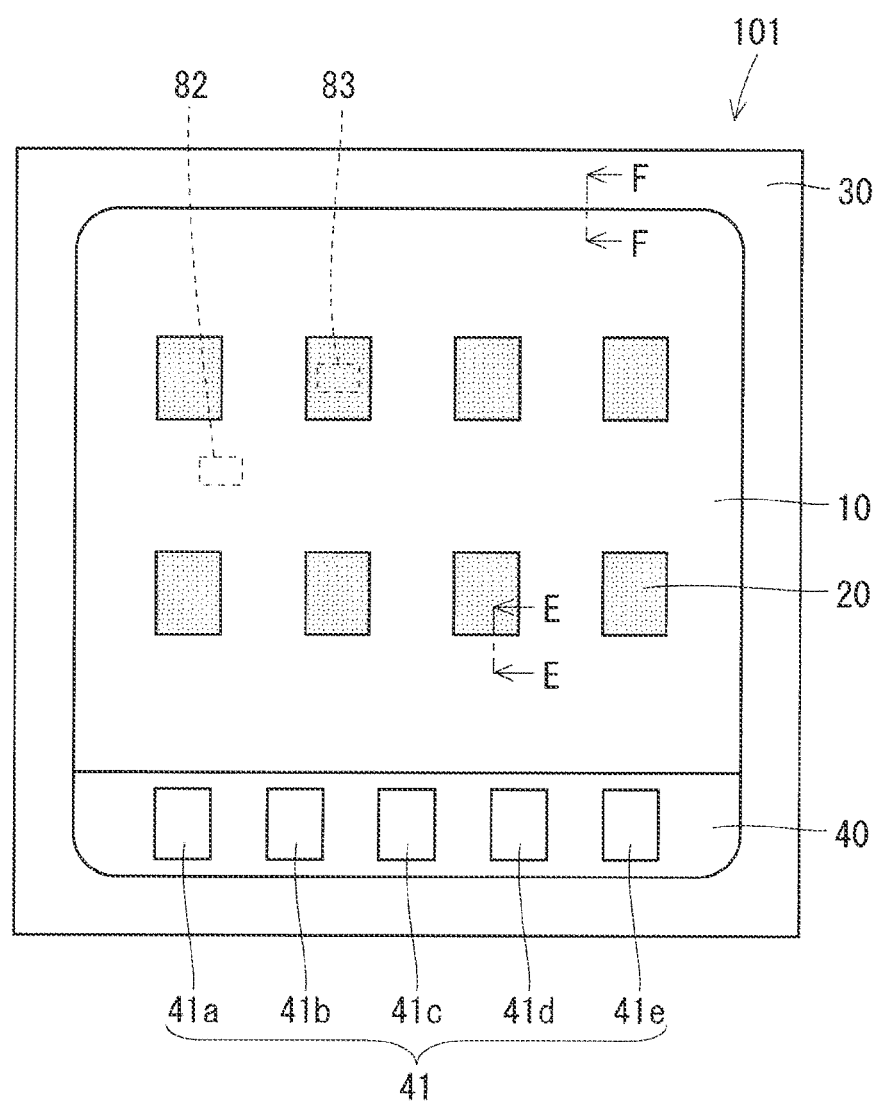

F I G. 8
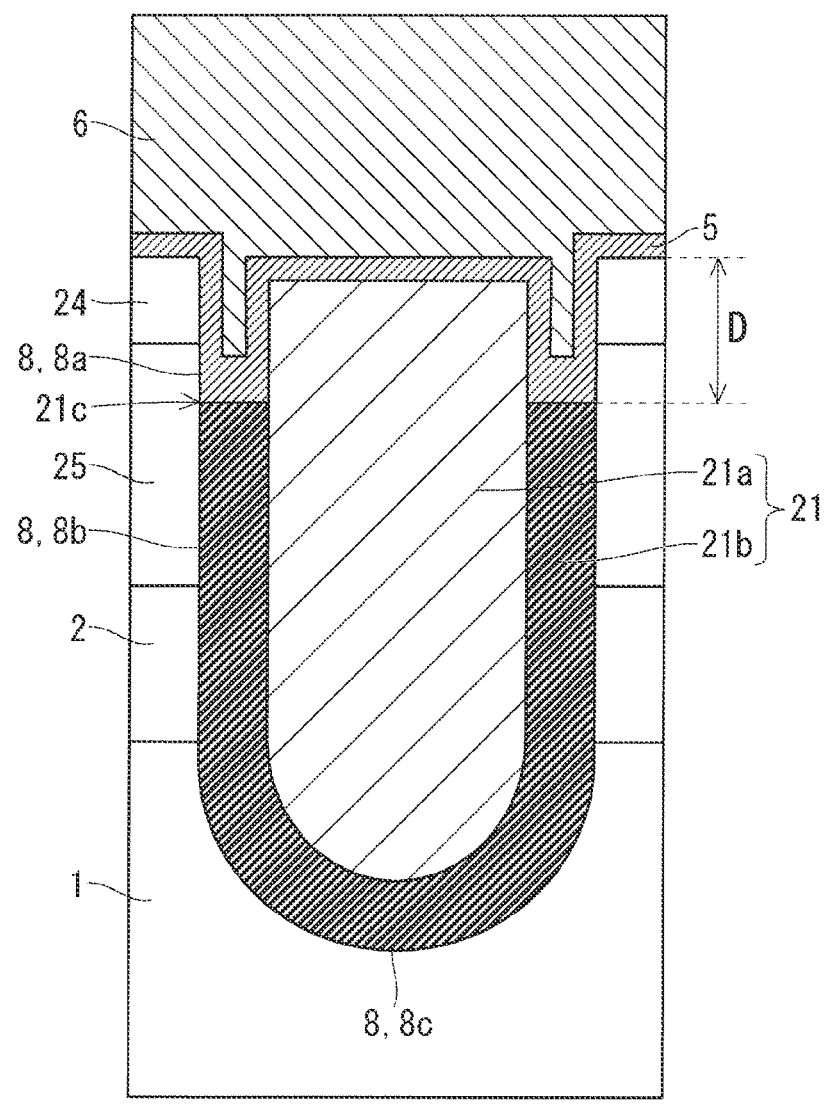

E-E CROSS SECTION

F I G. 16
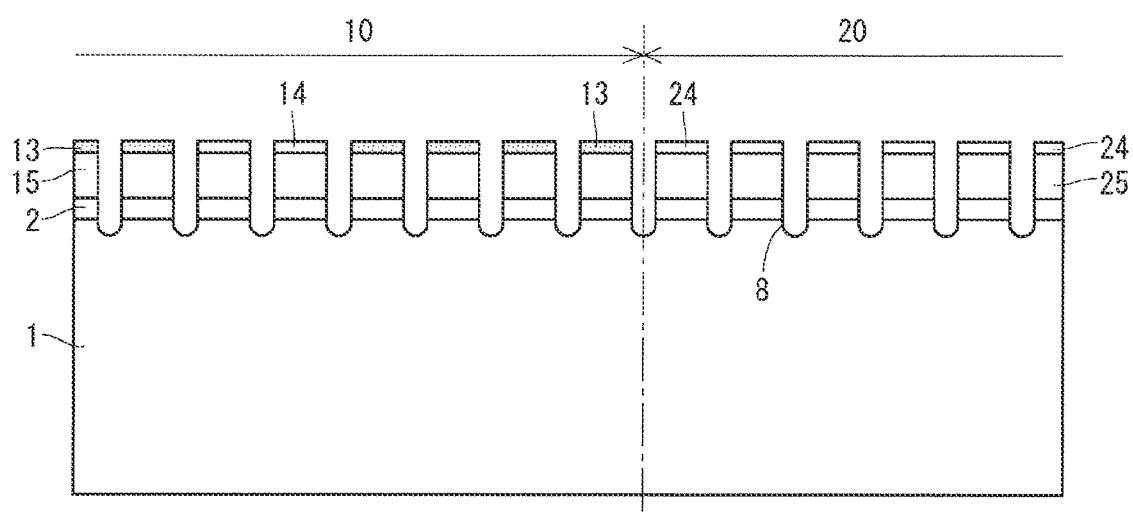

F I G. 1 9
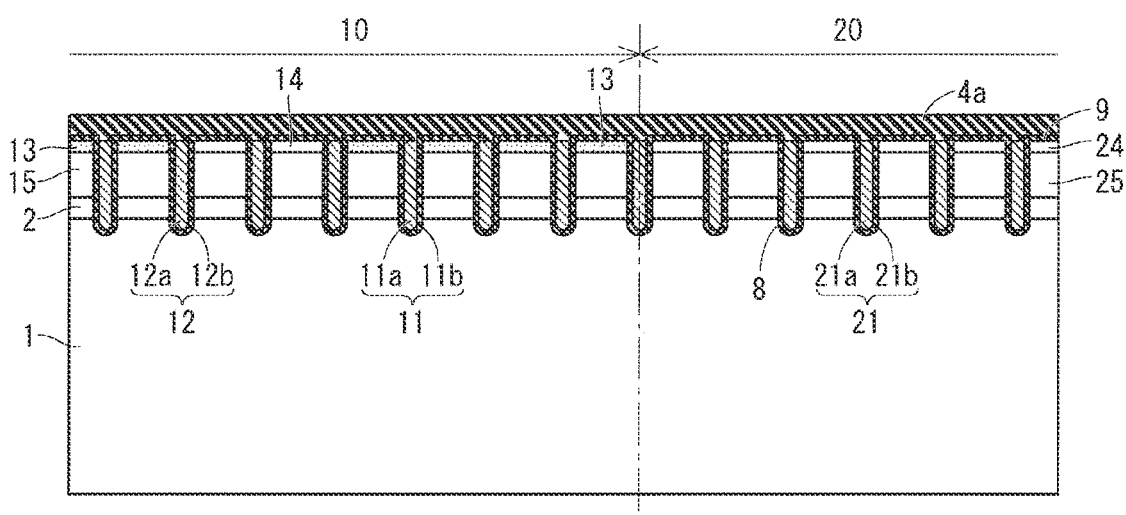

F I G. 2 1
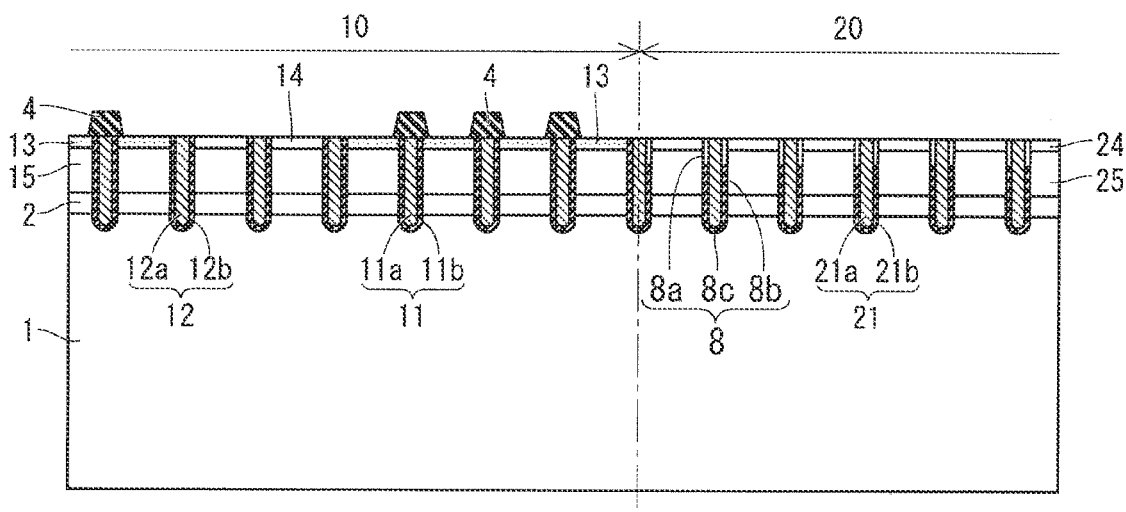

F I G. 2 3
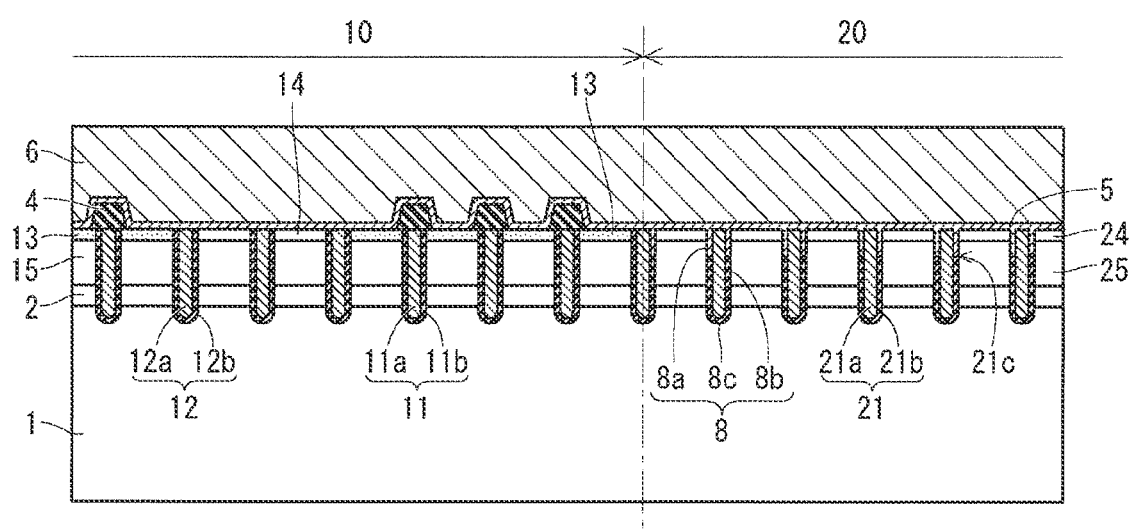

F I G. 2 6
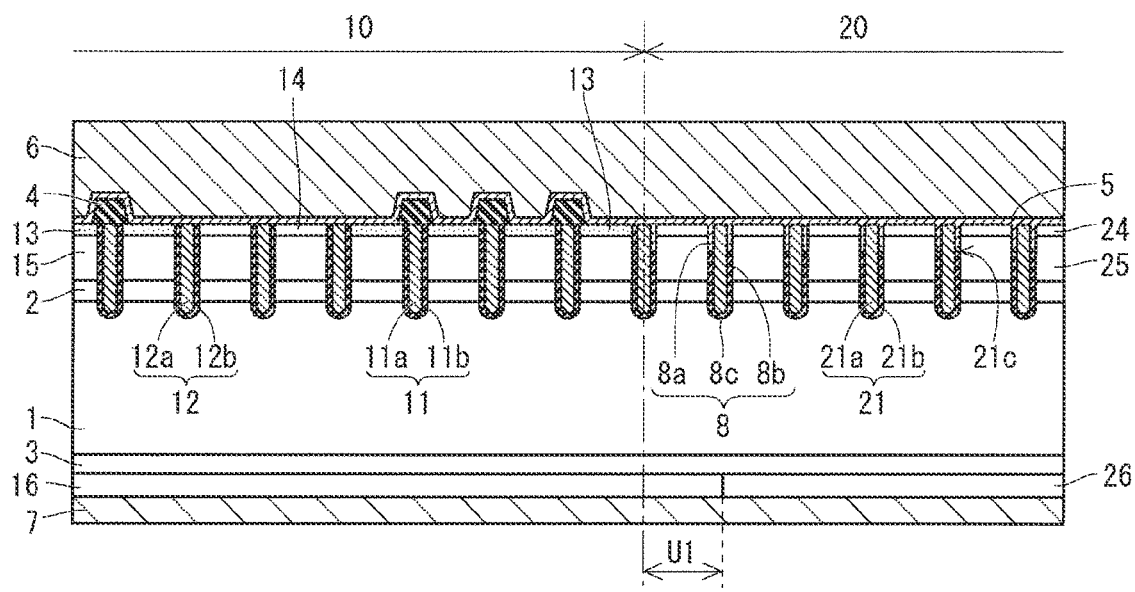

F I G. 3 1
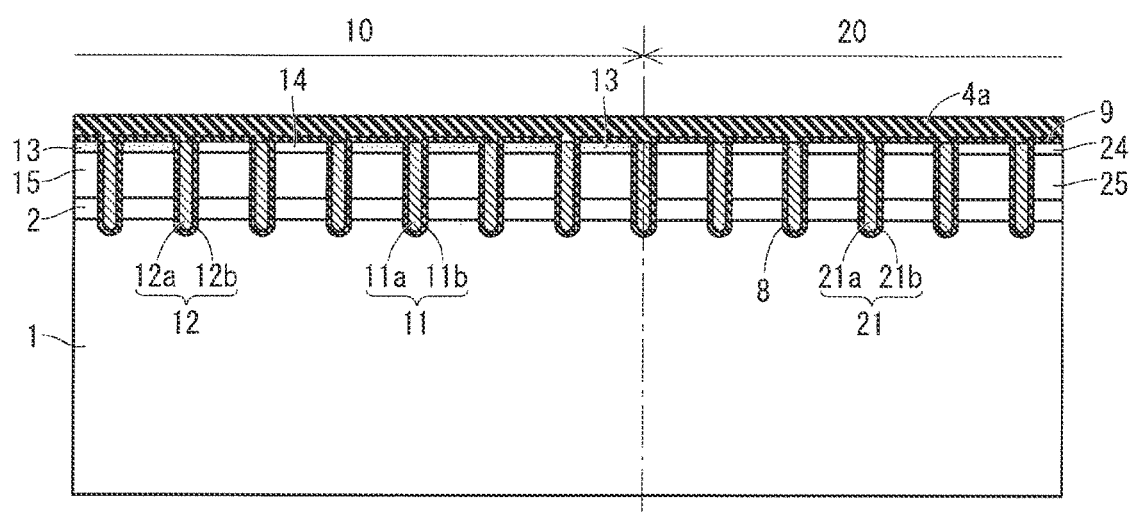

F I G. 3 4
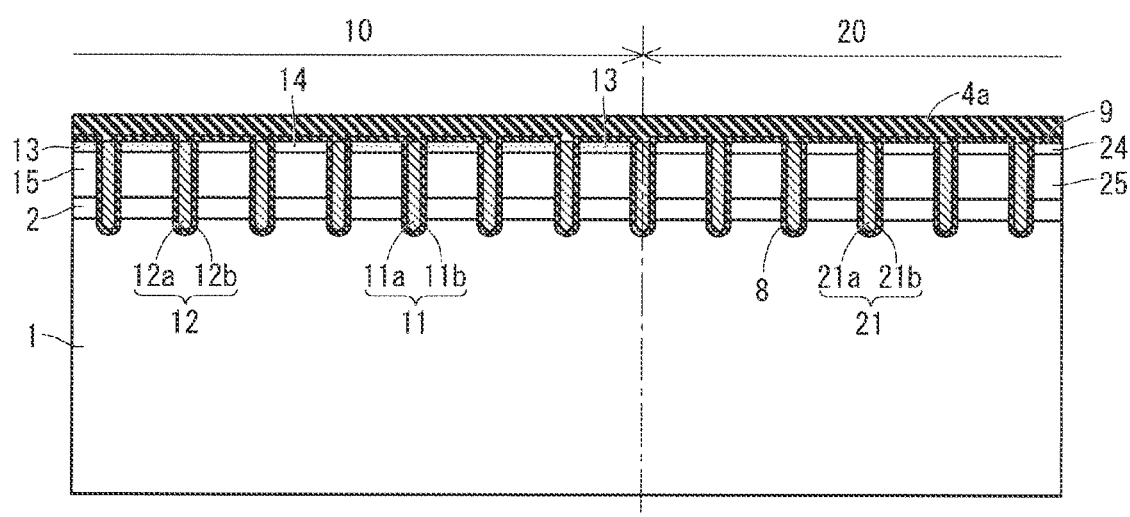

F I G. 3 5
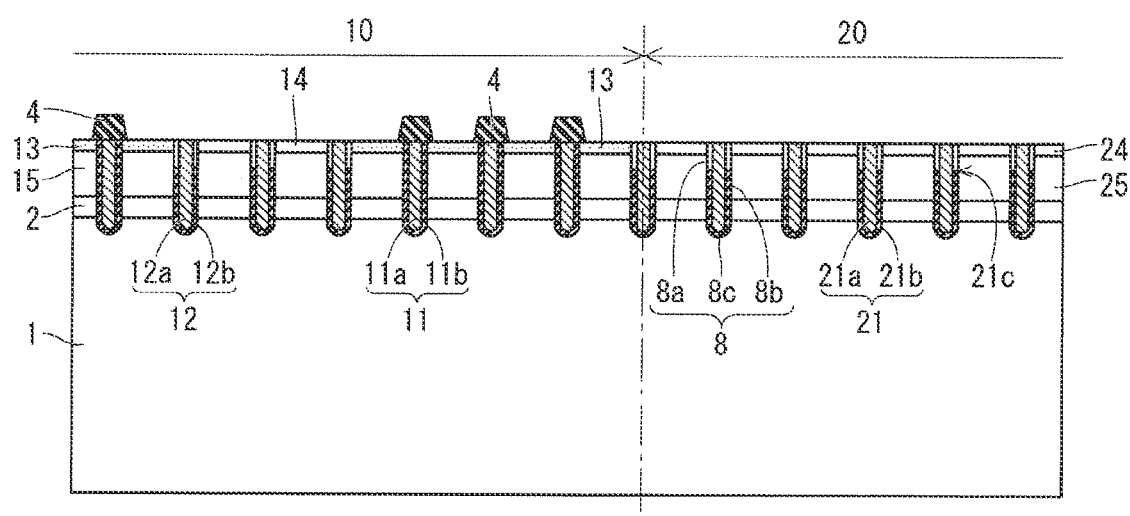

F I G. 3 6
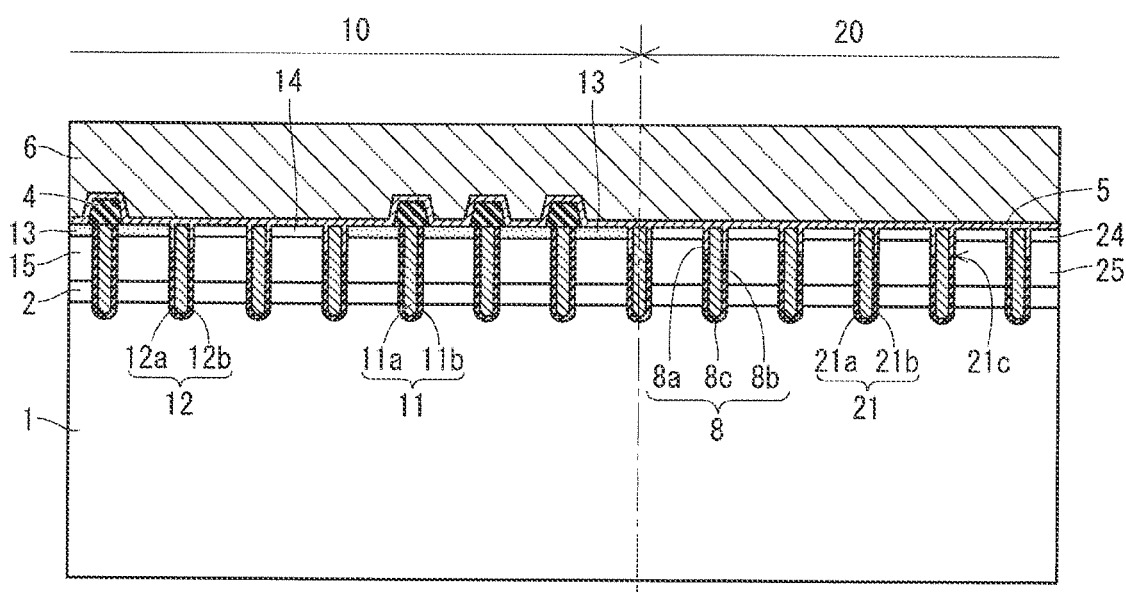

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing a semiconductor device.

Description of the Background Art

Reverse conducting insulated gate bipolar transistors (RC-IGBTs) are semiconductor devices that include both IGBT areas and diode areas provided in a single semiconductor substrate. The diode areas include freewheeling diodes. The freewheeling diodes each include a trench formed in the semiconductor substrate, a diode trench insulation film formed on the inner wall of the trench, and a diode trench electrode provided inside the trench via the diode trench insulation film. In the RC-IGBT described in Japanese Patent Application Laid-Open No. 2016-96222, each diode includes a trench gate (diode trench electrode) and a gate oxide film (diode trench insulation film) that is in contact with the trench gate. The trench gate is separated from the side surface of an anode layer by the gate oxide film and is thus not in contact with the side surface of the anode layer.

In the case where the side surface of the anode layer is separated from the diode trench electrode by the diode trench insulation film, the carrier density in the vicinity of the anode layer increases due to the injection enhanced (IE) effect, and a forward voltage drop decreases. On the other hand, recovery current increases and energy loss increases.

SUMMARY

In order to solve the problems described above, the present disclosure provides a semiconductor device that reduces energy loss.

The semiconductor device according to the present disclosure includes a semiconductor substrate, a first semiconductor layer of a first conductivity type, a second semiconductor layer of a second conductivity type, a diode trench gate, and an electrode layer. The first semiconductor layer of the first conductivity type is provided as a surface layer on an upper surface side of the semiconductor substrate. The second semiconductor layer of the second conductivity type is provided below the first semiconductor layer. The diode trench gate includes a diode trench insulation film and a diode trench electrode. The diode trench insulation film is formed on an inner wall of a trench that extends from an upper surface of the semiconductor substrate through the first semiconductor layer to the second semiconductor layer. The diode trench electrode is provided inside the trench. The electrode layer covers the surface layer of the semiconductor substrate. The diode trench insulation film is formed along, out of the inner wall of the trench, a bottom and a lower side wall that is located below an upper side wall located on an upper end side of the trench. The electrode layer further convers the upper side wall of the trench. The first semiconductor layer is in contact with the electrode layer on the upper side wall of the trench.

The semiconductor device according to the present disclosure reduces energy loss.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view illustrating one example of a configuration of a semiconductor device according to Embodiment 1;

FIG. 8 is an enlarged sectional view of an area illustrated in FIG. 7;

FIG. 16 is an illustration of a step of forming trenches;

FIG. 19 is an illustration of a step of forming an insulating material film;

FIG. 21 is an illustration of a step of forming contact holes in the diode area;

FIG. 23 is an illustration of a step of reducing the thickness of the semiconductor substrate;

FIG. 26 is an illustration of a step of forming a collector electrode;

FIG. 31 is an illustration of a step of forming an insulating material film;

FIG. 34 is an illustration of a step of forming an insulating material film;

FIG. 35 is an illustration of a step of forming contact holes;

FIG. 36 is an illustration of a step of forming a barrier metal and an emitter electrode;

DESCRIPTION OF THE PREFERRED EMBODIMENTS

Embodiment 1

In the following description, n and p indicate conductivity types of semiconductors. Specifically, n indicates a lower impurity concentration than n, and n+ indicates a higher impurity concentration than n. Similarly, p− indicates a lower impurity concentration than p, and p+ indicates a higher impurity concentration than p. P- and n-types of layers described below are interchangeable.

(1) Overall Planar Structure of Semiconductor Device

Figure 1:
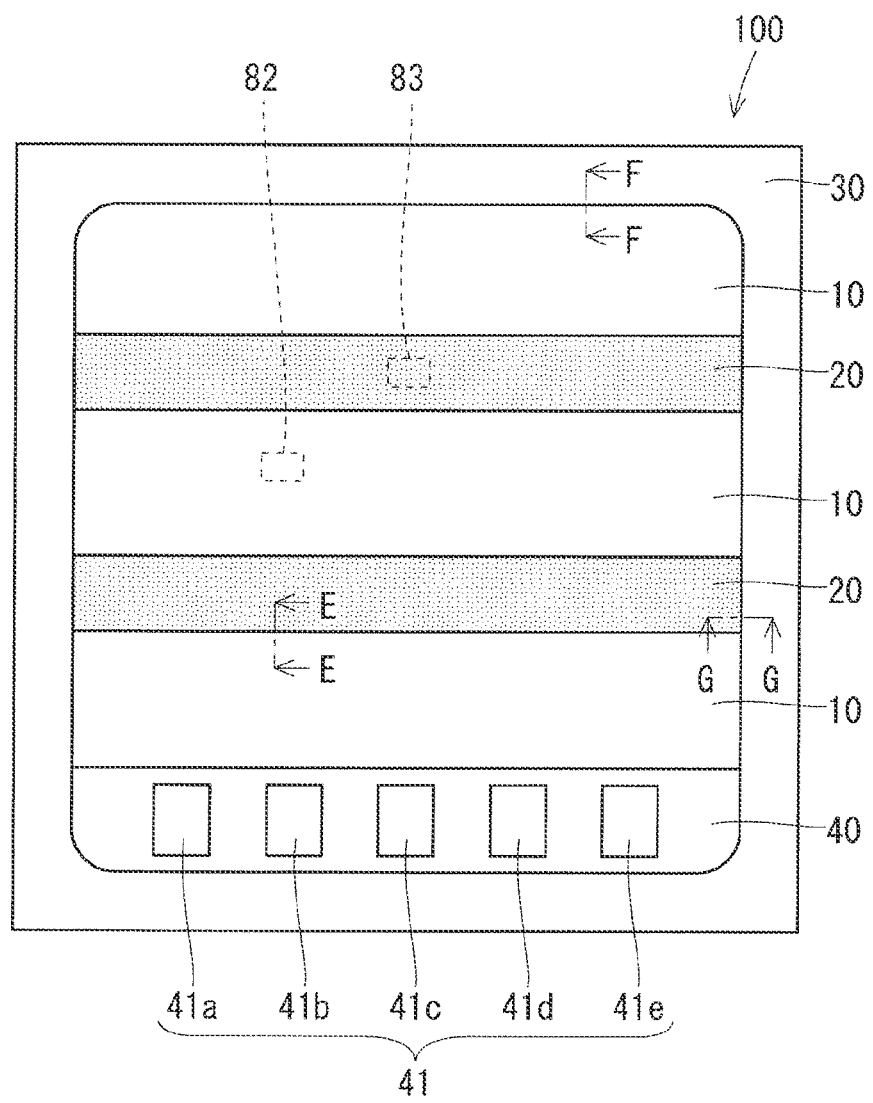
FIG. 1 is a plan view illustrating one example of a configuration of a semiconductor device according to Embodiment 1.

FIG. 1 is a plan view illustrating one example of a configuration of a semiconductor device 100 according to Embodiment 1. The semiconductor device 100 includes insulated gate bipolar transistor (IGBT) areas 10 and diode areas 20 in a single semiconductor substrate. The diode areas 20 are adjacent to the IGBT areas 10. The IGBT areas 10 have a plurality of IGBT cell structures (IGBT cells), and the diode areas 20 have a plurality of freewheeling diode cell structures (diode cells). The cell structures are structures corresponding to the smallest units of element. An area that includes the IGBT areas 10 and the diode areas 20 is referred to as a cell area. The semiconductor device 100 according to Embodiment 1 is a reverse conducting IGBT (RC-IGBT). For example, a semiconductor substrate is formed of a semiconductor such as Si or of a so-called wide bandgap semiconductor such as SiC or GaN.

The IGBT areas 10 and the diode areas 20 have stripe-like planar shapes. The IGBT areas 10 and the diode areas 20 extend in one direction in a plane of the semiconductor substrate. The IGBT areas 10 and the diode areas 20 are alternately arranged in a direction orthogonal to their direction of extension. Such a semiconductor device 100 is referred to as a "stripe-type semiconductor device."

FIG. 2 is a plan view illustrating one example of a configuration of a semiconductor device 101 according to Embodiment 1. Like the semiconductor device 100, the semiconductor device 101 is also an RC-IGBT that includes an IGBT area 10 and diode areas 20 in a single semiconductor substrate.

The diode areas 20 have an island-like planar shape. In the present example, a plurality of diode areas 20 are arranged side by side in both a longitudinal direction and a lateral direction in a plane of the semiconductor substrate. The IGBT area 10 surrounds each of the diode areas 20. Such a semiconductor device 101 is referred to as an "island-type semiconductor device."

The semiconductor devices 100 and 101 each include a pad area 40 and a termination area 30, in addition to the IGBT areas 10 and the diode areas 20.

The pad area 40 is provided outside the cell area, i.e., outside the IGBT areas 10 and the diode areas 20. In the present examples, the pad area 40 is provided adjacent to one IGBT area 10. The pad area 40 is an area including control pads 41 for controlling the semiconductor device. The control pads 41 include, for example, a current sensing pad 41a, a Kelvin emitter pad 41b, a gate pad 41c, and temperature sensing diode pads 41d and 41e.

The current sensing pad 41a is a control pad for sensing current flowing in the cell area. The current sensing pad 41a is electrically connected to some IGBT cells or some diode cells in the cell area so as to pass current that is a fraction of several or several tens of thousands of current flowing through the entire cell area.

The Kelvin emitter pad 41b and the gate pad 41c are control pads to which a gate driving voltage to control turn-on and turn-off of the semiconductor device is applied. The Kelvin emitter pad 41b is electrically connected to p-type base layers and n+-type source layers (not shown) of IGBT cells. The Kelvin emitter pad 41b and the p-type base layers may be electrically connected to each other via a p+-type contact layer (not shown). The gate pad 41c is electrically connected to gate trench electrodes (not shown) of IGBT cells.

The temperature sensing diode pads 41d and 41e are control pads that are electrically connected to the anodes and cathodes of temperature sensing diodes (not shown) provided in the cell area. The temperature sensing diode pads 41d and 41e measure voltages between the anodes and cathodes of the temperature sensing diodes to measure the temperature of the semiconductor device.

The termination area 30 is provided to surround an area that includes both the cell area and the pad area 40. The termination area 30 has a structure for sustaining the breakdown voltage of the semiconductor device. Any of various structures is appropriately selected as the breakdown-voltage sustaining structure. Examples of the breakdown-voltage sustaining structure include a field limiting ring (FLR) and a variation of lateral doping (VLD), which are formed in the surface layer on the first main surface side (upper surface side) of the semiconductor device. The FLR includes p-type terminal well layers (not shown) provided to surround the cell area. The VLD includes p-type well layers (not shown) provided to surround the cell area and having concentration gradients. The number of ring-shaped p-type terminal well layers 31 configuring the FLR and the concentration profile of the p-type well layers configuring the VLD are appropriately selected depending on the breakdown voltage design of the semiconductor device. The pad area 40 may further includes a p-type terminal well layer that is formed almost over the whole area. Alternatively, the pad area 40 may include IGBT cells or diode cells.

In FIG. 1, three IGBT areas 10 and two diode areas 20 are illustrated. However, the number of IGBT areas 10 and the number of diode areas 20 are not limited thereto. The number of IGBT areas 10 may be four or more, or two or less. The number of diode areas 20 may be three or more, or may be one. Each one diode area 20 illustrated in FIG. 1 is sandwiched between two IGBT areas 10. However, the arrangement of the IGBT areas 10 and the diode areas 20 are not limited thereto. The semiconductor device 100 may have a configuration in which the arrangement of the IGBT areas 10 and the diode areas 20 illustrated in FIG. 1 is reversed. That is, each one IGBT area 10 may be sandwiched between two diode areas 20. Alternatively, the same number of IGBT areas 10 and the same number of diode areas 20 may be provided adjacent to one another.

In FIG. 2, a plurality of diode areas 20 are arranged in a matrix with four columns in the right-left direction and two rows in the up-down direction. However, the number and arrangement of diode areas 20 are not limited thereto. The semiconductor device 101 may have a configuration in which at least one diode area 20 is scattered in the IGBT area 10. The diode areas 20 may be arranged so as to be surrounded by the IGBT area 10.

(2) Structure of IGBT Area 10

Figure 3:
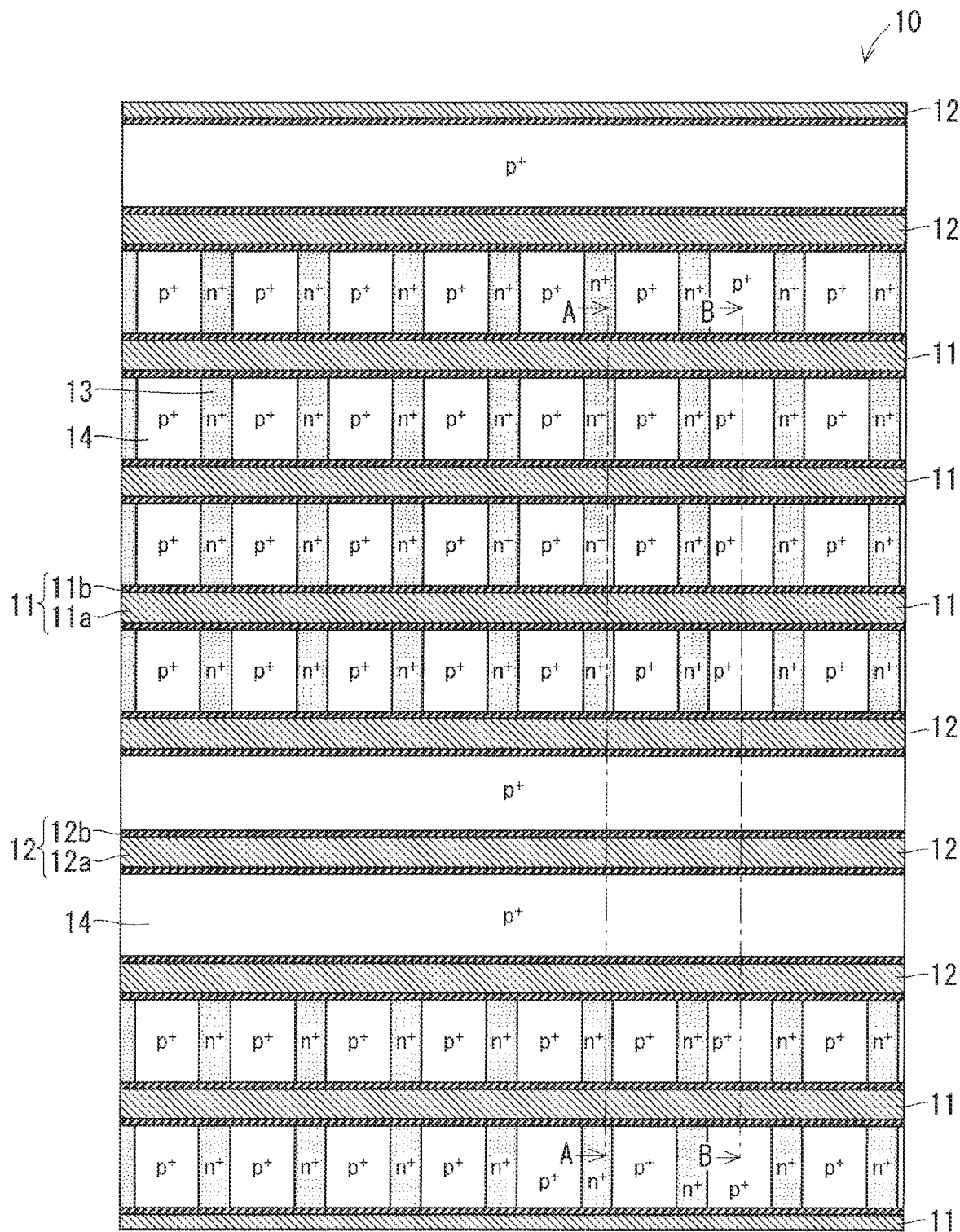
FIG. 3 is a partial enlarged plan view illustrating a configuration of an IGBT area in a semiconductor device according to Embodiment 1.

FIG. 3 is a partial enlarged plan view illustrating a configuration of one IGBT area 10 in the semiconductor device according to Embodiment 1. In FIG. 3, an area 82 in the semiconductor device 100 illustrated in FIG. 1 or in the semiconductor device 101 illustrated in FIG. 2 is illustrated in enlarged dimensions.

The semiconductor device 100 and the semiconductor device 101 each include active trench gates 11 and dummy trench gates 12 provided in the IGBT areas 10.

In the semiconductor device 100, the active trench gates 11 and the dummy trench gates 12 extend in the longitudinal direction of the IGBT area 10. In other words, the active trench gates 11 and the dummy trench gates 12 in the semiconductor device 100 have their length along the direction of extension of the IGBT area 10. The longitudinal direction of the IGBT area 10 corresponds to the right-left direction in FIG. 3.

In the semiconductor device 101, the active trench gates 11 and the dummy trench gates 12 extend in one direction in the IGBT area 10. For example, the active trench gates 11 and the dummy trench gates 12 extend in either of the up-down direction and the right-left direction in FIG. 2.

The active trench gates 11 each include a gate trench insulation film 11$b$ and a gate trench electrode 11$a$. Although details on the sectional structure of the active trench gates 11 will be described later, the gate trench insulation films 11$b$ are formed along the inner walls of trenches formed in the depth direction from the first main surface (upper surface) of the semiconductor substrate. The gate trench electrodes 11$a$ are formed inside the trenches via the gate trench insulation films 11$b$. The gate trench electrodes 11$a$ are electrically connected to the gate pad 41$c$ (not shown).

The dummy trench gates 12 each include a dummy trench insulation film 12$b$ and a dummy trench electrode 12$a$. Although details on the sectional structure of the dummy trench gates 12 will be described later, the dummy trench insulation films 12$b$ are formed along the inner walls of trenches formed in the depth direction from the first main surface of the semiconductor substrate. The dummy trench electrodes 12$a$ are formed inside the trenches via the dummy trench insulation films 12$b$. The dummy trench electrodes 12$a$ are electrically connected to an emitter electrode 6 (not shown in FIG. 3; see FIG. 4) that is provided above the first main surface of the semiconductor device 100 or 101.

In an area of the IGBT area 10 in which the active trench gates 11 are provided, an $n^+$-type source layer 13 and a $p^+$-type contact layer 14 are selectively provided as surface layers on the first main surface side of the semiconductor substrate. In Embodiment 1, the $n^+$-type source layer 13 and the $p^+$-type contact layer 14 are alternately provided in the direction of extension of the active trench gates 11 (longitudinal direction). The active trench gates 11 are provided across the $n^+$-type source layer 13 and the $p^+$-type contact layer 14. The $n^+$-type source layer 13 is in contact with the gate trench insulation films 11$b$ on both sides of the active trench gates 11 (in the direction perpendicular to the direction of extension). Details on the $n^+$-type source layer 13 and the $p^+$-type contact layer 14 will be described later.

In an area of the IGBT area 10 in which the dummy trench gates 12 are provided, the $p^+$-type contact layer 14 is provided as a surface layer on the first main surface side of the semiconductor substrate. The $p^+$-type contact layer 14 is provided between two dummy trench gates 12 adjacent to each other.

In FIG. 3, three dummy trench gates 12 are arranged adjacent to three active trench gates 11. Moreover, other three active trench gates 11 are arranged adjacent to the above three dummy trench gates 12. That is, an active trench gate group that includes three active trench gates 11 as a set and a dummy trench gate group that includes three dummy trench gates 12 as a set are arranged alternatively. The number of active trench gates 11 included in one active trench gate group is not limited to three, and may be one or more. The number of dummy trench gates 12 included in one dummy trench gate group is not limited to three, and may be one or more. However, the dummy trench gate 12 is not an absolute necessity for the semiconductor device 100 and the semiconductor device 101. That is, all the trench gates provided in the IGBT area 10 may be active trench gates 11.

Figure 4:
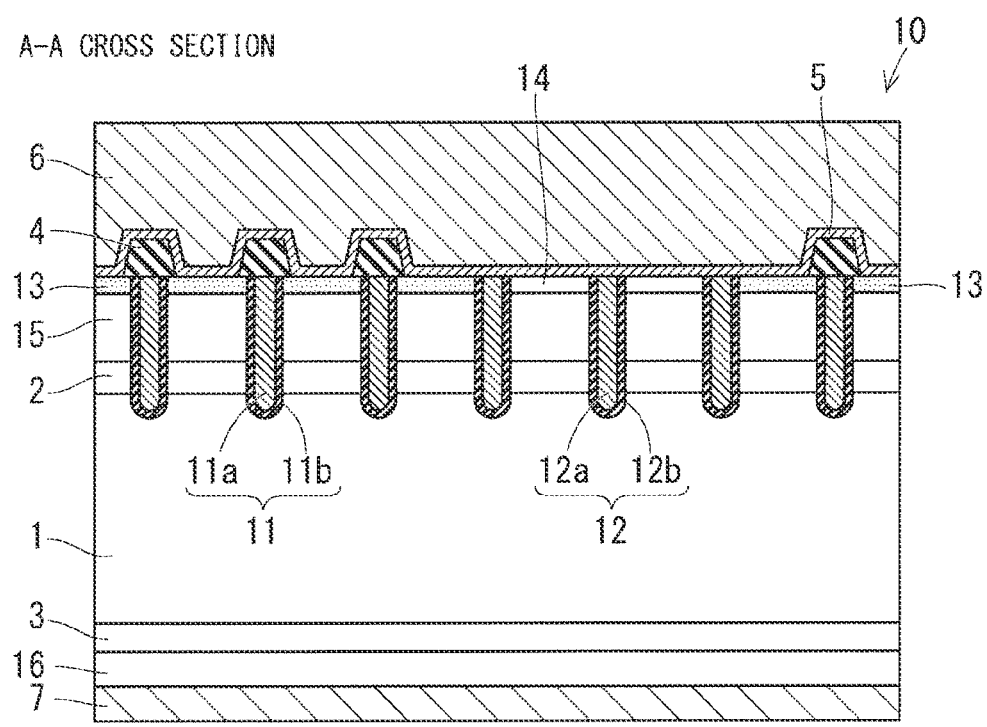
FIG. 4 is a sectional view illustrating the configuration of the IGBT area in the semiconductor device according to Embodiment 1.

FIG. 4 is a sectional view illustrating a configuration of one IGBT area 10 in the semiconductor device according to Embodiment 1. FIG. 4 is an illustration of a cross section taken along a line segment A-A illustrated in FIG. 3.

In the IGBT area 10, the semiconductor device 100 and the semiconductor device 101 each include the $n^+$-type source layer 13, the $p^+$-type contact layer 14, a p-type base layer 15, an n-type carrier storage layer 2, an $n^-$-type drift layer 1, an n-type buffer layer 3, a p-type collector layer 16, an interlayer insulation film 4, a barrier metal 5, the emitter electrode 6, and a collector electrode 7. The IGBT cells correspond to, for example, areas sectioned for each active trench gate 11. In that case, one IGBT cell includes the $n^+$-type source layer 13, the p-type base layer 15, the n-type carrier storage layer 2, the $n^-$-type drift layer 1, the n-type buffer layer 3, the p-type collector layer 16, the interlayer insulation film 4, the barrier metal 5, the emitter electrode 6, and the collector electrode 7.

The $n^-$-type drift layer 1 is formed as an inner layer of the semiconductor substrate. The $n^-$-type drift layer 1 is provided between the first and second main surfaces of the semiconductor substrate. The first main surface is the upper surface of the semiconductor substrate. The second main surface is the surface on the side opposite to the first main surface, i.e., the lower surface of the semiconductor substrate. The first main surface in the IGBT area 10 corresponds to the surfaces (upper surfaces) of the n$^+$-type source layer 13 and the p$^+$-type contact layer 14. The second main surface in the IGBT area 10 corresponds to the surface (lower surface) of the p-type collector layer 16. In the A-A section illustrated in FIG. 4, the semiconductor substrate corresponds to a range from the upper surfaces of the n$^+$-type source layer 13 and the p$^+$-type contact layer 14 to the lower surface of the p-type collector layer 16. The n$^-$-type drift layer 1 is derived from the structure of the substrate before each structure of the semiconductor device is formed on the first and second main surface sides of the semiconductor substrate. The n$^-$-type drift layer 1 is a semiconductor layer that contains, for example, arsenic (As) or phosphorus (P) as n-type impurities. The concentration of the n-type impurities is preferably higher than or equal to 1.0E+12/cm$^3$ and lower than or equal to 1.0E+15/cm$^3$.

The n-type carrier storage layer 2 is provided on the first main surface side of the semiconductor substrate with respect to the n$^-$-type drift layer 1. The n-type carrier storage layer 2 is a semiconductor layer that contains, for example, arsenic or phosphorus as n-type impurities. The n-type carrier storage layer 2 has a higher n-type impurity concentration than the n$^-$-type drift layer 1. The concentration of the n-type impurities is preferably higher than or equal to 1.0E+13/cm$^3$ and lower than or equal to 1.0E+17/cm$^3$. The n-type carrier storage layer 2 reduces current-carrying loss when current flows through the IGBT area 10.

The p-type base layer 15 is provided on the first main surface side of the semiconductor substrate with respect to the n-type carrier storage layer 2. The p-type base layer 15 is a semiconductor layer that contains, for example, boron (B) or aluminum (Al) as p-type impurities. The concentration of the p-type impurities is preferably higher than or equal to 1.0E+12/cm$^3$ and lower than or equal to 1.0E+19/cm$^3$. The p-type base layer 15 is in contact with the gate trench insulation films 11*b* of the active trench gates 11. When a gate driving voltage is applied to the gate trench electrodes 11*a*, a channel is formed in the p-type base layer 15.

The n$^+$-type source layer 13 is provided on the first main surface side of the semiconductor substrate with respect to the p-type base layer 15. The n$^+$-type source layer 13 is selectively provided as a surface layer of the semiconductor substrate on the upper surface side of the p-type base layer 15. The surface (upper surface) of the n$^+$-type source layer 13 forms the first main surface of the semiconductor substrate in the IGBT area 10. The n$^+$-type source layer 13 is a semiconductor layer that contains, for example, arsenic or phosphorus as n-type impurities. The concentration of the n-type impurities is preferably higher than or equal to 1.0E+17/cm$^3$ and lower than or equal to 1.0E+20/cm$^3$. Note that the n$^+$-type source layer 13 may be referred to as an n$^+$-type emitter layer.

The p$^+$-type contact layer 14 is provided on the first main surface side of the semiconductor substrate with respect to the p-type base layer 15. The p$^+$-type contact layer 14 is selectively provided as a surface layer of the semiconductor substrate on the upper surface side of the p-type base layer 15. The p$^+$-type contact layer 14 is provided in an area where the n$^+$-type source layer 13 is not provided on the upper surface side of the p-type base layer 15. The surface (upper surface) of the p$^+$-type contact layer 14 forms the first main surface of the semiconductor substrate in the IGBT area 10. The p$^+$-type contact layer 14 is a semiconductor layer that contains, for example, boron or aluminum as p-type impurities. The p$^+$-type contact layer 14 has a higher p-type impurity concentration than the p-type base layer 15. The concentration of the p-type impurities is preferably higher than or equal to 1.0E+15/cm$^3$ and lower than or equal to 1.0E+20/cm$^3$.

The n-type buffer layer 3 is provided on the second main surface side of the semiconductor substrate with respect to the n$^-$-type drift layer 1. The n-type buffer layer 3 is a semiconductor layer that contains, for example, phosphorus or proton (H$^+$) as n-type impurities. The n-type buffer layer 3 has a higher n-type impurity concentration than the n$^-$-type drift layer 1. The concentration of the n-type impurities is preferably higher than or equal to 1.0E+12/cm$^3$ and lower than or equal to 1.0E+18/cm$^3$. When the semiconductor device 100 is in the off state, the n-type buffer layer 3 reduces the occurrence of punch-through as a result of a depletion layer extending from the p-type base layer 15 to the second main surface side.

The p-type collector layer 16 is provided on the second main surface side of the semiconductor substrate with respect to the n-type buffer layer 3. The surface (lower surface) of the p-type collector layer 16 forms the second main surface of the semiconductor substrate. The p-type collector layer 16 is a semiconductor layer that contains, for example, boron or aluminum as p-type impurities. The concentration of the p-type impurities is preferably higher than or equal to 1.0E+16/cm$^3$ and lower than or equal to 1.0E+20/cm$^3$.

The active trench gates 11 extend from the first main surface of the semiconductor substrate through the n$^+$-type source layer 13, the p-type base layer 15, and the n-type carrier storage layer 2 to the n$^-$-type drift layer 1.

The gate trench insulation films 11*b* are formed along the inner walls of trenches formed in the depth direction from the first main surface of the semiconductor substrate. The gate trench insulation films 11*b* are, for example, oxide films.

The gate trench electrodes 11*a* are formed inside the trenches via the gate trench insulation films 11*b*. The bottoms of the gate trench electrodes 11*a* face the n$^-$-type drift layer 1 via the gate trench insulation films 11*b*. The gate trench insulation films 11*b* are in contact with the n$^+$-type source layer 13 and the p-type base layer 15. For example, the gate trench electrodes 11*a* are formed of conductive polysilicon. When a gate driving voltage is applied to the gate trench electrodes 11*a*, a channel is formed in the p-type base layer 15 that is in contact with the gate trench insulation films 11*b*.

The dummy trench gates 12 extend from the first main surface of the semiconductor substrate through the p$^+$-type contact layer 14, the p-type base layer 15, and the n-type carrier storage layer 2 to the n$^-$-type drift layer 1.

The dummy trench insulation films 12*b* are formed along the inner walls of trenches formed in the depth direction from the first main surface of the semiconductor substrate. The dummy trench insulation films 12*b* are, for example, oxide films.

The dummy trench electrodes 12*a* are formed inside the trenches via the dummy trench insulation films 12*b*. The bottoms of the dummy trench electrodes 12*a* face the n$^-$-type drift layer 1 via the dummy trench insulation films 12*b*. Out of the dummy trench insulation films 12*b* located on both sides of one dummy trench electrode 12*a*, the dummy trench insulation film 12*b* at least on one side is not in contact with the n$^+$-type source layer 13. The dummy trench electrode 12*a* is formed of, for example, conductive polysilicon.

The interlayer insulation film 4 is provided on the gate trench electrodes 11a of the active trench gates 11.

The barrier metal 5 is formed on the interlayer insulation film 4 and on an area of the first main surface of the semiconductor substrate where the interlayer insulation film 4 is not provided. The barrier metal 5 is formed of, for example, titanium-containing metal such as Ti, TiN, or TiSi. TiSi is an alloy of titanium and silicon (Si). The barrier metal 5 provides Ohmic contact among the $n^+$-type source layer 13, the $p^+$-type contact layer 14, and the dummy trench electrode 12a. The barrier metal 5 is electrically connected to the $n^+$-type source layer 13, the $p^+$-type contact layer 14, and the dummy trench electrode 12a.

The emitter electrode 6 is provided on the barrier metal 5. The emitter electrode 6 is preferably formed of, for example, an aluminum alloy (Al—Si based alloy) that contains aluminum and silicon. The emitter electrode 6 is electrically connected to the $n^+$-type source layer 13, the $p^+$-type contact layer 14, and the dummy trench electrodes 12a via the barrier metal 5.

The collector electrode 7 is provided on the p-type collector layer 16. Like the emitter electrode 6, the collector electrode 7 is preferably formed of an aluminum alloy. The collector electrode 7 is in ohmic contact with the p-type collector layer 16 and electrically connected to the p-type collector layer 16.

Figure 5:
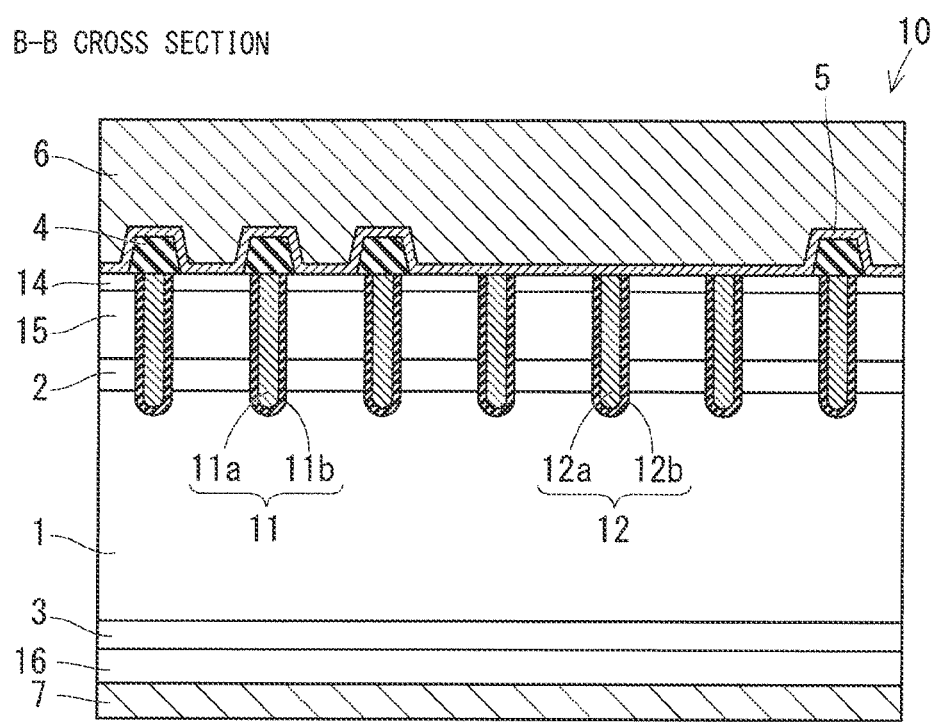
FIG. 5 is a sectional view illustrating the configuration of the IGBT area in the semiconductor device according to Embodiment 1.

FIG. 5 is a sectional view illustrating a configuration of one IGBT area 10 in the semiconductor device according to Embodiment 1. FIG. 5 is an illustration of a cross section taken along a line segment B-B illustrated in FIG. 3.

The cross section taken along the line segment B-B illustrated in FIG. 5 differs from the cross section taken along the line segment A-A illustrated in FIG. 4 in that the $n^+$-type source layer 13 is not provided as a surface layer on the first main surface side of the semiconductor substrate. That is, the $n^+$-type source layer 13 is selectively provided on the upper surface side of the p-type base layer 15 as illustrated in FIG. 3.

While the structure of the IGBT area 10 has been described thus far, the structure of the IGBT area 10 is not limited to the above-described structure. For example, the $p^+$-type contact layer 14 and the p-type base layer 15 may be combined and defined as a single p-type base layer.

The n-type carrier storage layer 2 and the $n^-$-type drift layer 1 may be combined and defined as a single n-type drift layer. The n-type carrier storage layer 2 is not an absolute necessity, and the $n^-$-type drift layer 1 may be provided in the position of the n-type carrier storage layer 2.

The n-type buffer layer 3 and the $n^-$-type drift layer 1 may be combined and defined as a single n-type drift layer. Moreover, the n-type carrier storage layer 2, the n-type buffer layer 3, and the $n^-$-type drift layer 1 may be combined and defined as a single n-type drift layer. The n-type buffer layer 3 is not an absolute necessity, and the $n^-$-type drift layer 1 may be provided in the position of the n-type buffer layer 3.

The barrier metal 5 is also not an absolute necessity. When the barrier metal 5 is not provided, the emitter electrode 6 is provided on the $n^+$-type source layer 13, the $p^+$-type contact layer 14, and the dummy trench electrodes 12a and is in ohmic contact with these layers and electrodes. Alternatively, the barrier metal 5 may be provided only on the n-type semiconductor layer such as the $n^+$-type source layer 13. The barrier metal 5 and the emitter electrode 6 may be combined and defined as a single emitter electrode. The interlayer insulation film 4 may be provided on part of the dummy trench electrodes 12a. In that case, the emitter electrode 6 is electrically connected to the dummy trench electrodes 12a in any area of the dummy trench electrodes 12a.

The emitter electrode 6 may be formed of a plurality of metal films that include an aluminum alloy film and other metal films. For example, the emitter electrode 6 may be formed of an aluminum alloy film and a plating film. The plating film is formed by, for example, electroless plating or electroplating. For example, the plating film may be a nickel (Ni) film. Alternatively, a tungsten film may be formed in minute areas such as the spaces between two interlayer insulation films 4 adjacent to each other. The emitter electrode 6 is formed to cover this tungsten film. The tungsten film has better embeddedness than the plating film, so that an excellent emitter electrode 6 is formed.

The collector electrode 7 may be formed of an aluminum alloy and a plating film. The collector electrode 7 may have a different configuration from the configuration of the emitter electrode 6.

(3) Structure of Diode Area 20

Figure 6:
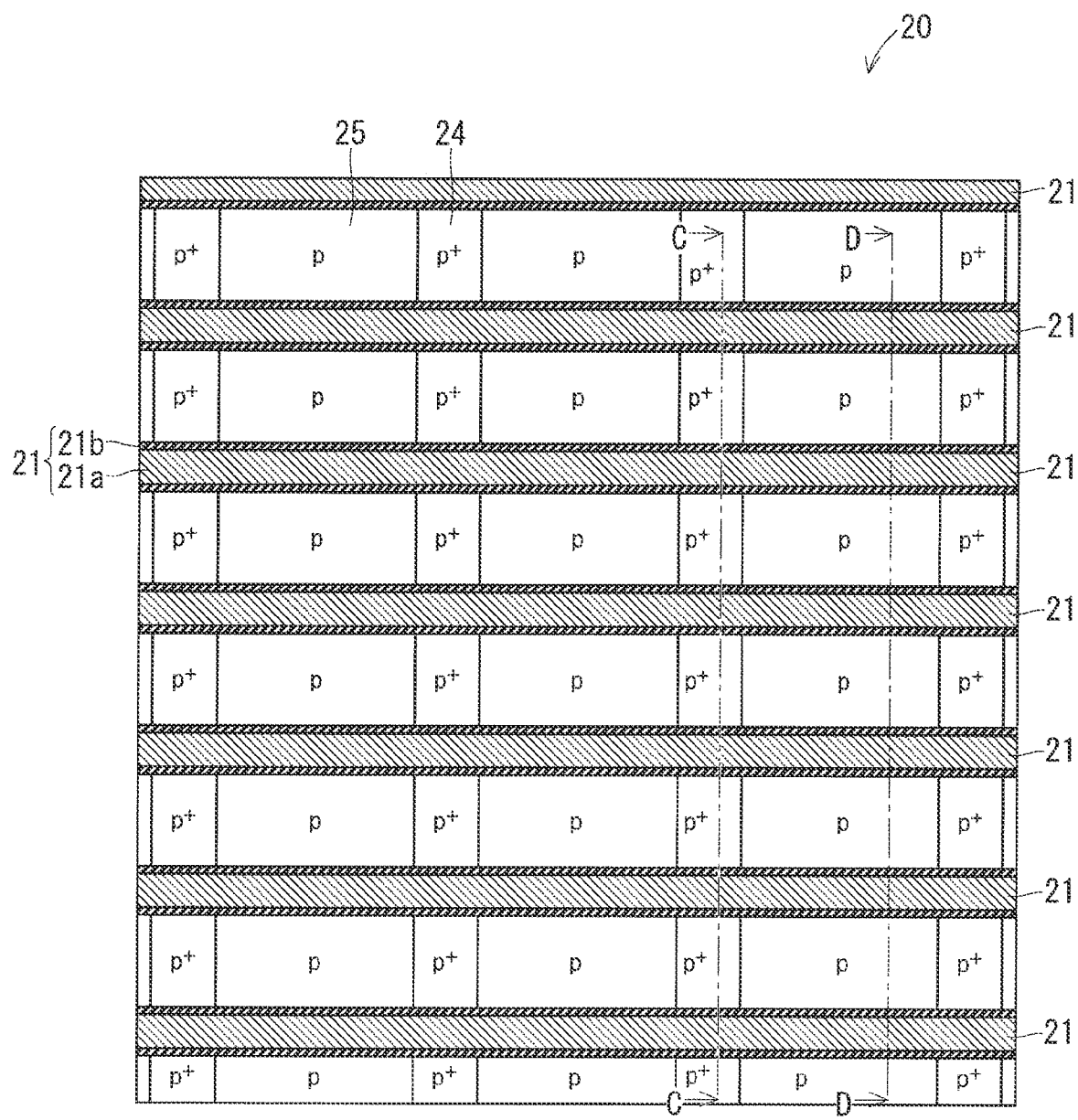
FIG. 6 is a partial enlarged plan view illustrating a configuration of a diode area in a semiconductor device according to Embodiment 1.

FIG. 6 is a partial enlarged plan view illustrating a configuration of one diode area 20 in the semiconductor device according to Embodiment 1. In FIG. 6, an area 83 in the semiconductor device 100 illustrated in FIG. 1 or in the semiconductor device 101 illustrated in FIG. 2 is illustrated in enlarged dimensions.

The semiconductor device 100 and the semiconductor device 101 each include diode trench gates 21 provided in the diode area 20.

The diode trench gates 21 extend in one direction in the diode area 20. The diode trench gates 21 according to Embodiment 1 extend in the same direction as the active trench gates 11 and the dummy trench gates 12.

The diode trench gates 21 each include a diode trench insulation film 21b and a diode trench electrode 21a. Although a detailed sectional structure of the diode trench gate 21 will be described later, the diode trench insulation films 21b are formed along the inner walls of trenches formed in the depth direction from the first main surface of the semiconductor substrate. The diode trench electrodes 21a are formed inside the trenches via the diode trench insulation films 21b.

In the diode area 20, a $p^+$-type contact layer 24 and a p-type anode layer 25 are selectively provided as a surface layer on the first main surface side of the semiconductor substrate. In Embodiment 1, the $p^+$-type contact layer 24 and the p-type anode layer 25 are alternatively provided in the direction of extension (longitudinal direction) of the diode trench gates 21. The diode trench gates 21 are provided across the $p^+$-type contact layer 24 and the p-type anode layer 25. The $p^+$-type contact layer 24 and the p-type anode layer 25 are provided between two diode trench gates 21 adjacent to each other. Details on the $p^+$-type contact layer 24 and the p-type anode layer 25 will be described later.

Figure 7:
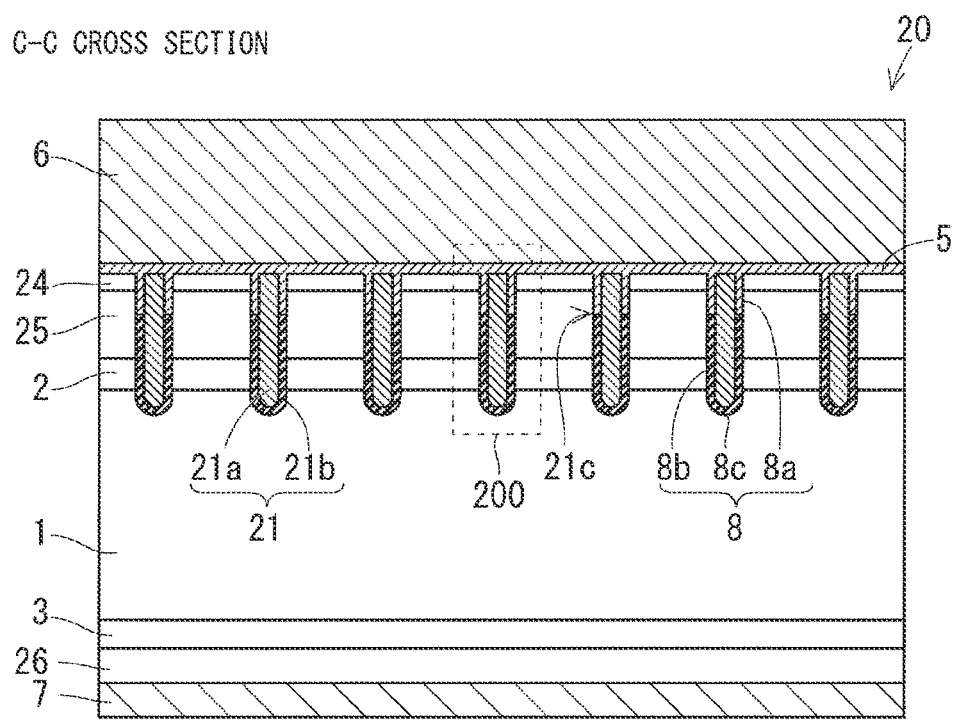
FIG. 7 is a sectional view illustrating the configuration of the diode area in the semiconductor device according to Embodiment 1.

FIG. 7 is a sectional view illustrating the configuration of the diode area 20 in the semiconductor device according to Embodiment 1. FIG. 7 is an illustration of a cross section taken along a line segment C-C illustrated in FIG. 6. FIG. 8 is an enlarged sectional view of an area 200 illustrated in FIG. 7.

In the diode area 20, the semiconductor device 100 and the semiconductor device 101 each include the $p^+$-type contact layer 24, the p-type anode layer 25, the n-type carrier storage layer 2, the $n^-$-type drift layer 1, the n-type buffer layer 3, an $n^+$-type cathode layer 26, the barrier metal 5, the emitter electrode 6, and the collector electrode 7. The diode cells correspond to, for example, areas sectioned for each diode trench gate 21. In that case, one diode cell includes the p$^+$-type contact layer 24, the p-type anode layer 25, the n-type carrier storage layer 2, the n$^-$-type drift layer 1, the n-type buffer layer 3, the n$^+$-type cathode layer 26, the barrier metal 5, the emitter electrode 6, and the collector electrode 7.

The n-type drift layer 1 is formed as an inner layer of the semiconductor substrate. Like the n$^-$-type drift layer 1 in the IGBT area 10, the n$^-$-type drift layer 1 in the diode area 20 is provided between the first and second main surfaces of the semiconductor substrate. In an area of the diode area 20 where the p$^+$-type contact layer 24 is provided, the first main surface of the semiconductor substrate corresponds to the surface (upper surface) of the p$^+$-type contact layer 24. The first main surface in that diode area 20 is contiguous with the first main surface in the IGBT area 10. The second main surface in the diode area 20 corresponds to the surface (lower surface) of the n$^+$-type cathode layer 26. The second main surface in the diode area 20 is contiguous with the second main surface in the IGBT area 10. In the cross section illustrated in FIG. 7, the semiconductor substrate corresponds to a range from the upper surface of the p$^+$-type contact layer 24 to the lower surface of the n$^+$-type cathode layer 26. Like the n$^-$-type drift layer 1 in the IGBT area 10, the n$^-$-type drift layer 1 in the diode area 20 is derived from the structure of the substrate before each structure is formed on the first and second main surface sides of the semiconductor substrate. That is, the n$^-$-type drift layer 1 in the diode area 20 is continuously and integrally formed with the n$^-$-type drift layer 1 in the IGBT area 10. In other words, the n$^-$-type drift layer 1 in the diode area 20 and the n$^-$-type drift layer 1 in the IGBT area 10 are formed on the same semiconductor substrate.

The n-type carrier storage layer 2 is provided on the first main surface side of the semiconductor substrate with respect to the n$^-$-type drift layer 1. The n-type carrier storage layer 2 provided in the diode area 20 extends in the same plane as the n-type carrier storage layer 2 provided in the IGBT area 10. For example, the n-type carrier storage layer 2 in the diode area 20 has the same thickness and the same impurity concentration as the n-type carrier storage layer 2 in the IGBT area 10.

The p-type anode layer 25 is provided on the first main surface side of the semiconductor substrate with respect to the n-type carrier storage layer 2. The p-type anode layer 25 is a semiconductor layer that contains, for example, boron or aluminum as p-type impurities. The concentration of the p-type impurities is preferably higher than or equal to $1.0E+12/cm^3$ and lower than or equal to $1.0E+19/cm^3$. For example, the p-type anode layer 25 has the same p-type impurity concentration as the p-type base layer 15 in the IGBT area 10. When the p-type anode layer 25 and the p-type base layer 15 have the same p-type impurity concentration, for example, the p-type anode layer 25 is formed simultaneously with the p-type base layer 15. Alternatively, for example, the p-type anode layer 25 may have a lower p-type impurity concentration than the p-type base layer 15 in the IGBT area 10. When the p-type anode layer 25 has a lower p-type impurity concentration, the number of holes injected into the diode area 20 decreases during operation of the diode. Accordingly, recovery loss decreases during operation of the diode.

The p$^+$-type contact layer 24 is provided on the first main surface side of the semiconductor substrate with respect to the p-type anode layer 25. In the C-C cross section illustrated in FIG. 7, the p$^+$-type contact layer 24 covers the entire surface of the p-type anode layer 25. However, the p$^+$-type contact layer 24 is selectively provided on the upper surface side of the p-type anode layer 25 as illustrated in FIG. 6. That is, in the diode area 20, the p$^+$-type contact layer 24 is selectively provided on the upper surface side of the p-type anode layer 25 as a surface layer on the first main surface side of the semiconductor substrate. The p$^+$-type contact layer 24 is a semiconductor layer that contains, for example, boron or aluminum as p-type impurities. The p$^+$-type contact layer 24 has a higher p-type impurity concentration than the p-type anode layer 25. The concentration of the p-type impurities is preferably higher than or equal to $1.0E+15/cm^3$ and lower than or equal to $1.0E+20/cm^3$.

The n-type buffer layer 3 is provided on the second main surface side of the semiconductor substrate with respect to the n$^-$-type drift layer 1. The n-type buffer layer 3 provided in the diode area 20 extends in the same plane as the n-type buffer layer 3 provided in the IGBT area 10. For example, the n-type buffer layer 3 in the diode area 20 has the same thickness and the same impurity concentration as the n-type buffer layer 3 in the IGBT area 10.

The n$^+$-type cathode layer 26 is provided on the second main surface side of the semiconductor substrate with respect to the n-type buffer layer 3. The surface (lower surface) of the n$^+$-type cathode layer 26 forms the second main surface of the semiconductor substrate. The n$^+$-type cathode layer 26 is a semiconductor layer that contains, for example, arsenic or phosphorus as n-type impurities. The concentration of the n-type impurities is preferably higher than or equal to $1.0E+16/cm^3$ and lower than or equal to $1.0E+21/cm^3$.

The diode trench gate 21 extends from the first main surface of the semiconductor substrate through the p$^+$-type contact layer 24, the p-type anode layer 25, and the n-type carrier storage layer 2 to the n$^-$-type drift layer 1.

The diode trench insulation films 21b are formed along the inner walls of trenches 8 formed in the depth direction from the first main surface of the semiconductor substrate. The diode trench insulation films 21b are, for example, oxide films.

The diode trench electrodes 21a are formed inside the trenches 8 via the diode trench insulation films 21b. The bottoms of the diode trench electrodes 21a face the n-type drift layer 1 via the diode trench insulation films 21b. The diode trench electrodes 21a are formed of, for example, conductive polysilicon.

The diode trench insulation films 21b are formed along lower side walls 8b and bottoms 8c of the trenches 8, out of the inner walls of the trenches 8. The lower side walls 8b are located below the upper side walls 8a located on the upper end side of the trenches 8. The upper side walls 8a of the trenches 8 are not covered with the diode trench insulation films 21b.

The diode trench insulation films 21b have upper ends 21c located below the upper surfaces of the diode trench electrodes 21a and above the n-type carrier storage layer 2. More preferably, the upper ends 21c of the diode trench insulation films 21b are located below the p$^+$-type contact layer 24. The upper ends 21c of the diode trench insulation films 21b correspond to the lower ends of the upper side walls 8a and the upper ends of the lower side walls 8b of the trenches 8. Part of the side surface of the p-type anode layer 25 is not covered with the diode trench insulation films 21b. On the other hand, the side surface of the n-type carrier storage layer 2 is covered with the diode trench insulation films 21b. A depth D from the first main surface of the semiconductor substrate to the upper end 21c of the diode trench insulation film 21b is preferably greater than or equal to 0.5 μm.

The barrier metal 5 covers not only on the tops of the p+-type contact layer 24 and the diode trench electrodes 21a, but also the upper side walls 8a of the trenches 8 and the side surfaces of the diode trench electrodes 21a. Like the barrier metal 5 in the IGBT area 10, the barrier metal 5 is formed of titanium-containing metal such as Ti, TiN, or TiSi. The barrier metal 5 is in ohmic contact with the p+-type contact layer 24 and the diode trench electrodes 21a. The barrier metal 5 is also in ohmic contact with the side surfaces of the p-type anode layer 25 and the p+-type contact layer 24 on the upper side walls 8a of the trenches 8.

The emitter electrode 6 is provided on the barrier metal 5. Like the emitter electrode 6 in the IGBT area 10, the emitter electrode 6 is preferably formed of, for example, an aluminum alloy (Al—Si based alloy). The emitter electrode 6 is electrically connected to the diode trench electrodes 21a, the p+-type contact layer 24, and the p-type anode layer 25 via the barrier metal 5.

The collector electrode 7 is provided on the n+-type cathode layer 26. Like the collector electrode 7 in the IGBT area 10, the collector electrode 7 is preferably formed of an aluminum alloy. The collector electrode 7 is in ohmic contact with the n+-type cathode layer 26.

Figure 9:
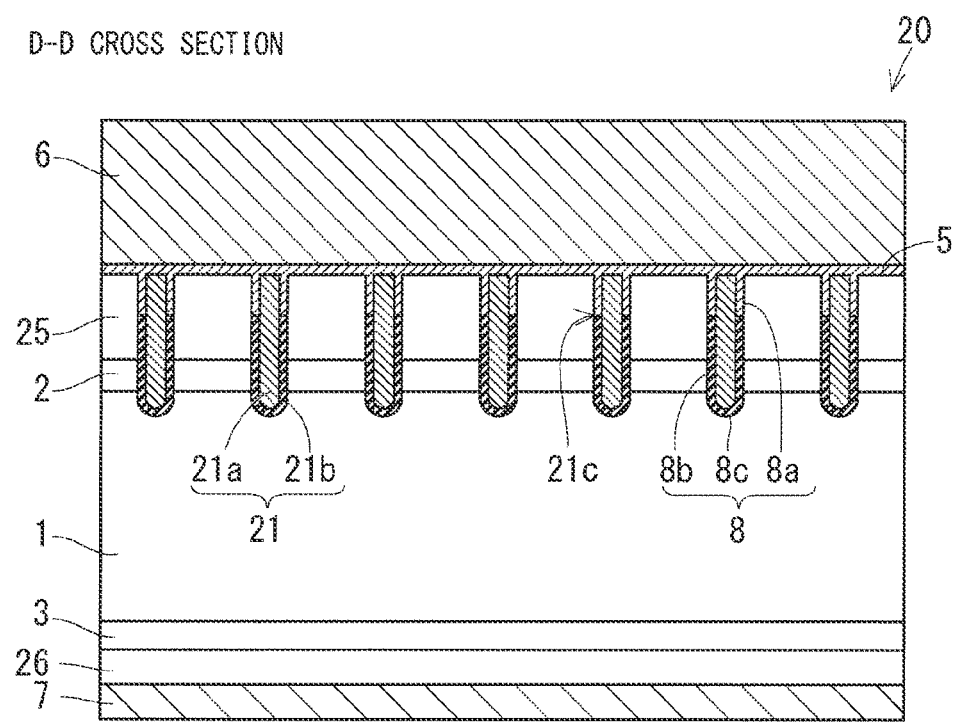
FIG. 9 is a sectional view illustrating the configuration of the diode area in the semiconductor device according to Embodiment 1.

FIG. 9 is a sectional view illustrating a configuration of one diode area 20 in the semiconductor device according to Embodiment 1. FIG. 9 is an illustration of a cross section taken along a line segment D-D illustrated in FIG. 6.

The cross section taken along the line segment D-D and illustrated in FIG. 9 differs from the cross section taken along the line segment C-C illustrated in FIG. 7 in that the p+-type contact layer 24 is not provided on the first main surface side of the semiconductor substrate. That is, the p+-type contact layer 24 is selectively provided on the upper surface side of the p-type anode layer 25 as illustrated in FIG. 6. In a region of the diode area 20 in which the p+-type contact layer 24 is not provided, the first main surface of the semiconductor substrate corresponds to the surface (upper surface) of the p-type anode layer 25. In the cross section illustrate in FIG. 9, one diode cell incudes the p-type anode layer 25, the n-type carrier storage layer 2, the n−-type drift layer 1, the n-type buffer layer 3, the n+-type cathode layer 26, the barrier metal 5, the emitter electrode 6, and the collector electrode 7.

In the cross section taken along D-D, the barrier metal 5 is also in ohmic contact with the side surface of the p-type anode layer 25 that is exposed on the upper side wall 8a of the trench 8.

Although the structure of the diode area 20 has been described thus far, the structure of the diode area 20 is not limited to the above-described structure. For example, the p+-type contact layer 24 and the p-type anode layer 25 may be combined and defined as a single p-type anode layer. The p+-type contact layer 24 may have the same p-type impurity concentration as the p+-type contact layer 14 in the IGBT area 10, or may have a different p-type impurity concentration.

The n-type carrier storage layer 2 and the n−-type drift layer 1 may be combined and defined as a single n−-type drift layer. The n-type carrier storage layer 2 in the diode area 20 is not an absolute necessity, and the n−-type drift layer 1 may be provided in the position of the n-type carrier storage layer 2. Even in the case where the n-type carrier storage layer 2 is provided in the IGBT area 10, the n-type carrier storage layer 2 does not necessarily have to be provided in the diode area 20.

The n-type buffer layer 3 and the n−-type drift layer 1 may be combined and defined as a single n−-type drift layer.

Moreover, the n-type carrier storage layer 2, the n-type buffer layer 3, and the n−-type drift layer 1 may be combined and defined as a single n−-type drift layer. The n-type buffer layer 3 is not an absolute necessity, and the n−-type drift layer 1 may be provided in the position of the n-type buffer layer 3.

The n+-type cathode layer 26 may be provided all over in the diode area 20, or may be provided in part of the diode area 20. Although not shown, the semiconductor device 100 and the semiconductor device 101 each may further include a semiconductor layer in which the n+-type cathode layer 26 and a p+-type cathode layer are alternately arranged, as a semiconductor layer that forms the second main surface of the semiconductor substrate in the diode area 20. Such a structure is formed by, for example, a step of selectively implanting p-type impurities into part of the area in which the n+-type cathode layer 26 is formed. The diode including a semiconductor layer in which the n+-type cathode layer 26 and the p+-type cathode layer are alternately arranged, is referred to as a relaxed field of cathode (RFC) diode.

The barrier metal 5 is not an absolute necessity. In the case where the barrier metal 5 is not provided, the emitter electrode 6 covers not only the tops of the p-type anode layer 25, the p+-type contact layer 24, and the diode trench electrode 21a, but also the upper side walls 8a of the trenches 8 and the side surfaces of the diode trench electrodes 21a. The emitter electrode 6 is in ohmic contact with the side surfaces of the p-type anode layer 25 and the p+-type contact layer 24 on the upper side walls 8a of the trenches 8 (not shown). The interlayer insulation film 4 may be provided on part of the diode trench electrodes 21a. In that case, the emitter electrode 6 is electrically connected to the diode trench electrodes 21a in any of areas on the diode trench electrodes 21a.

(4) Structure of Boundary Portion Between IGBT Area 10 and Diode Area 20

Figure 10:
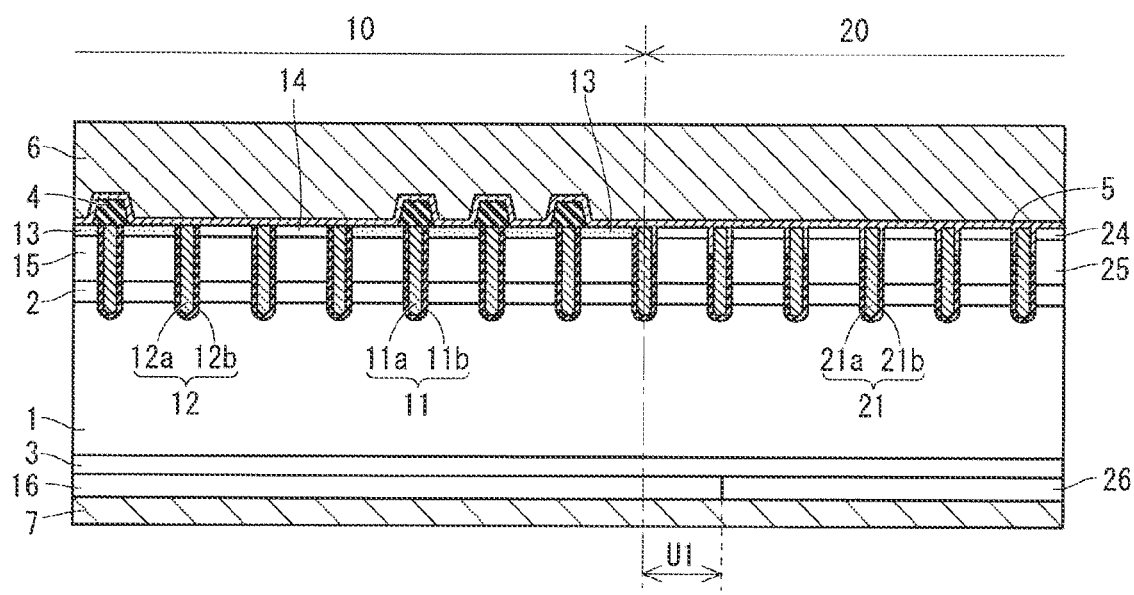
FIG. 10 is a sectional view illustrating a configuration of a boundary portion between an IGBT area and a diode area.

FIG. 10 is a sectional view illustrating a configuration of a boundary portion between the IGBT area 10 and the diode area 20. FIG. 10 is an illustration of a cross section taken along a line segment E-E illustrated in FIG. 1 or 2.

The p-type collector layer 16 provided on the second main surface side of the IGBT area 10 extends beyond the boundary between the IGBT area 10 and the diode area 20 toward the diode area 20 by a distance U1. In this case, the distances between the n+-type cathode layer 26 and the active trench gates 11 increase as compared with the case where the p-type collector layer 16 does not extend off toward the diode area 20. This structure reduces current flowing from the channel formed adjacent to the active trench gates 11 to the n+-type cathode layer 26 even if the gate driving voltage is applied to the gate trench electrodes 11a during operation of the freewheeling diodes. The distance U1 may, for example, be 100 μm. However, the distance U1 may be 0 μm or may be smaller than 100 μm, depending on the application of the semiconductor device 100 or the semiconductor device 101.

(5) Structure of Termination Area 30

Figure 11:
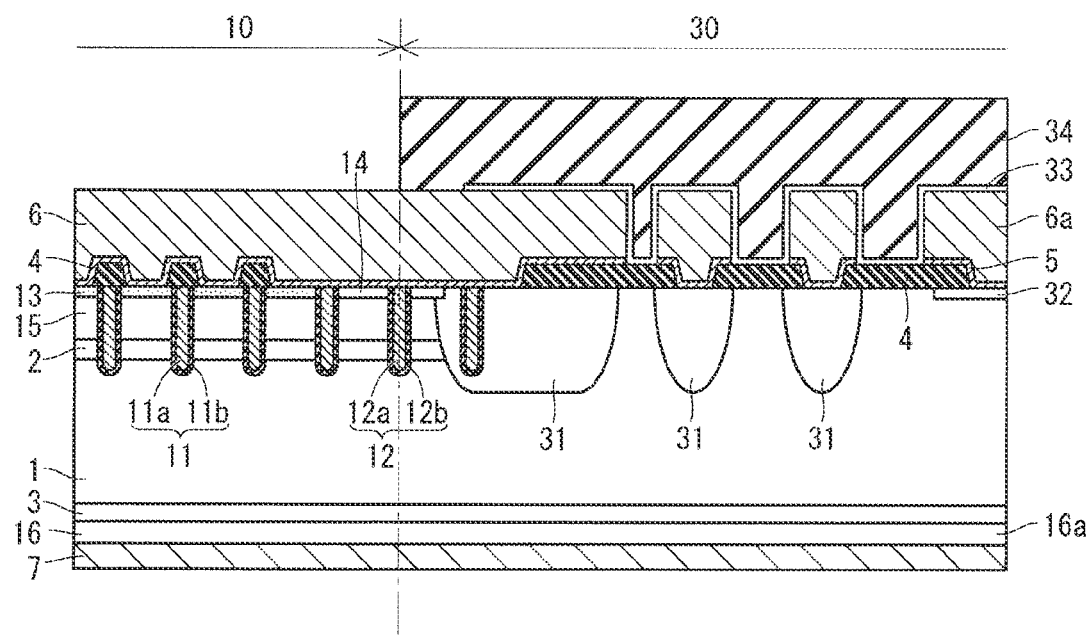
FIG. 11 is a sectional view illustrating a configuration of a boundary portion between an IGBT area and a termination area.
Figure 12:
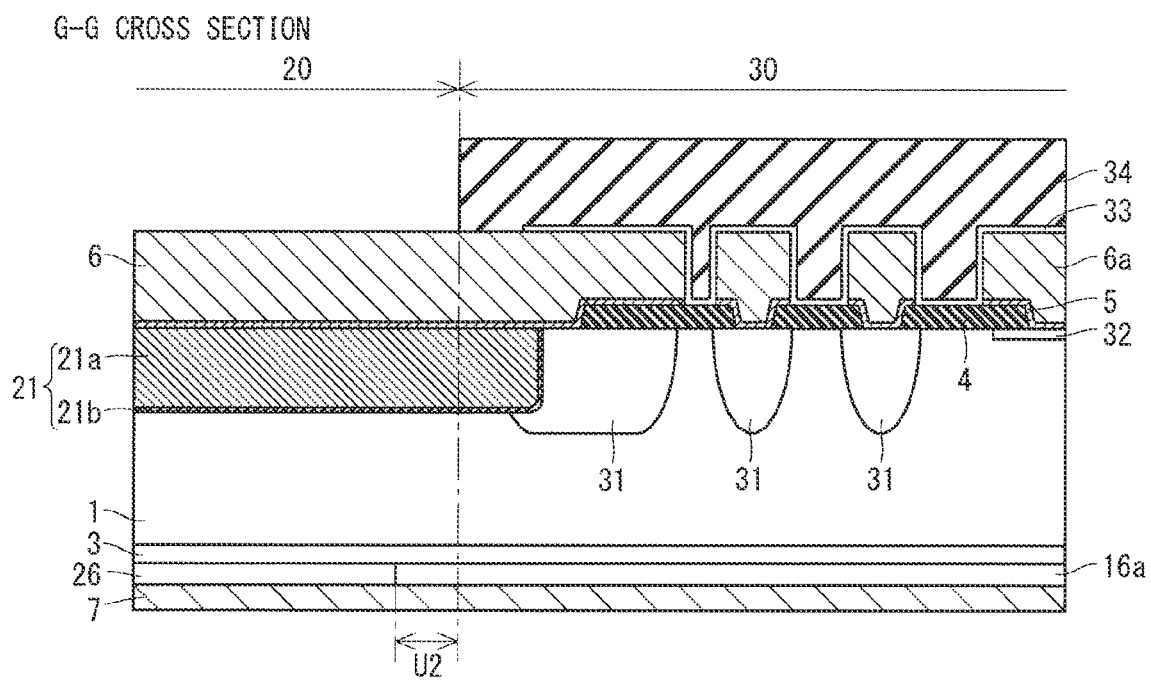
FIG. 12 is a sectional view illustrating a configuration of a boundary portion between a diode area and a termination area.

FIG. 11 is a sectional view illustrating a configuration of a boundary portion between the IGBT area 10 and the termination area 30. FIG. 11 is an illustration of a cross section taken along a line segment F-F in FIG. 1 or 2. FIG. 12 is a sectional view illustrating a configuration of a boundary portion between the diode area 20 and the termination area 30. FIG. 12 is an illustration of a cross section taken along a line segment G-G illustrated in FIG. 1.

In the termination area 30, the semiconductor device 100 and the semiconductor device 101 each include the n−-type drift layer 1, p-type terminal well layers 31, an n$^+$-type channel stopper layer 32, the n-type buffer layer 3, a p-type terminal collector layer 16a, the interlayer insulation film 4, the barrier metal 5, the emitter electrode 6, terminal electrodes 6a, a semi-insulating film 33, a terminal protective film 34, and the collector electrode 7.

Like the n$^-$-type drift layers 1 in the IGBT area 10 and the diode area 20, the n-type drift layer 1 in the termination area 30 is provided between the first and second main surfaces of the semiconductor substrate. However, part of the n$^-$-type drift layer 1 in the termination area 30 is exposed from the first main surface as a surface layer of the semiconductor substrate. The first main surface in the termination area 30 corresponds to the surfaces of the n$^-$-type drift layer 1, the p-type terminal well layers 31, and the n$^+$-type channel stopper layer 32. That is, the first main surface in the termination area 30 corresponds to the upper surfaces of the n$^-$-type drift layer 1, the p-type terminal well layer 31, and the n$^+$-type channel stopper layer 32 in FIG. 11. The first main surface in the termination area 30 is contiguous with the first main surface in the IGBT area 10 or the diode area 20. The second main surface in the termination area 30 corresponds to the surface of the p-type terminal collector layer 16a. That is, the second main surface in the termination area 30 corresponds to the lower surface of the p-type terminal collector layer 16a in FIG. 11. The second main surface in the termination area 30 is contiguous with the second main surface in the IGBT area 10 or the diode area 20. Like the n$^-$-type drift layers 1 in the IGBT area 10 and the diode area 20, the n-type drift layer 1 in the termination area 30 is derived from the structure of the substrate before each structure is formed on the first and second main surface sides of the semiconductor substrate. That is, the n$^-$-type drift layer 1 in the termination area 30 is continuously and integrally formed with the n$^-$-type drift layers 1 in the IGBT area 10 and the diode area 20. In other words, the n$^-$-type drift layers 1 in the termination area 30, the IGBT area 10, and the diode area 20 are formed on the same semiconductor substrate.

The p-type terminal well layers 31 are provided on the first main surface side of the semiconductor substrate with respect to the n$^-$-type drift layer 1. The p-type terminal well layers 31 are provided to surround the cell area in plan view. In Embodiment 1, three p-type terminal well layers 31 form a triple ring in plan view and surround the cell area. The three p-type terminal well layers 31 form an FLR. The number of p-type terminal well layers 31 is not limited to three. The number of p-type terminal well layers 31 is appropriately selected depending on the breakdown voltage design of the semiconductor device 100 or the semiconductor device 101. The p-type terminal well layers 31 are semiconductor layers that contain, for example, boron or aluminum as p-type impurities. The concentration of the p-type impurities are higher than or equal to 1.0E+14/cm$^3$ and lower than or equal to 1.0E+19/cm$^3$.

The n$^+$-type channel stopper layer 32 is provided on the first main surface side of the semiconductor substrate with respect to the n$^-$-type drift layer 1. The n$^+$-type channel stopper layer 32 is provided outward of the p-type terminal well layers 31 in plan view. The n$^+$-type channel stopper layer 32 is provided to surround the p-type terminal well layers 31.

The n-type buffer layer 3 is provided on the second main surface side of the semiconductor substrate with respect to the n$^-$-type drift layer 1. The n-type buffer layer 3 provided in the termination area 30 has the same configuration as the n-type buffer layer 3 provided in the IGBT area 10 or the diode area 20. The n-type buffer layer 3 provided in the termination area 30 is continuously and integrally formed with the n-type buffer layer 3 provided in the IGBT area 10 or the diode area 20. The n-type buffer layer 3 and the n$^-$-type drift layer 1 may be combined and defined as a single n$^-$-type drift layer. The n-type buffer layer 3 is not an absolute necessity. The n$^-$-type drift layer 1 may be provided in the position of the n-type buffer layer 3.

The p-type terminal collector layer 16a is provided on the second main surface side of the semiconductor substrate with respect to the n-type buffer layer 3. The p-type terminal collector layer 16a has the same configuration as the p-type collector layer 16 provided in the IGBT area 10. The p-type terminal collector layer 16a is continuously and integrally formed with the p-type collector layer 16 provided in the IGBT area 10. The p-type terminal collector layer 16a in the termination area 30 and the p-type collector layer 16 in the IGBT area 10 may be combined and defined as a single p-type collector layer.

As illustrated in FIG. 12, the p-type terminal collector layer 16a extends beyond the boundary between the diode area 20 and the termination area 30 toward the diode area 20 by a distance U2. This structure increases the distances between the n$^+$-type cathode layer 26 and the p-type terminal well layers 31, as compared with the structure in which the p-type terminal collector layer 16a does not extend off toward the diode area 20. This structure prevents the p-type terminal well layers 31 from operating as the anodes of the freewheeling diodes. The distance U2 may, for example, be 100 μm.

The interlayer insulation film 4 is provided on the first main surface of the semiconductor substrate. The interlayer insulation film 4 has contact holes. The positions of the contact holes correspond to the positions of the p-type terminal well layers 31 and the n$^+$-type channel stopper layer 32. The surfaces of the p-type terminal well layers 31 or the n$^+$-type channel stopper layer 32 are exposed through the contact holes.

The barrier metal 5 is provided on the p-type terminal well layers 31 and on the n$^+$-type channel stopper layer 32.

The emitter electrode 6 is provided so as to be electrically connected, via the barrier metal 5, to the p-type terminal well layers 31 close to the IGBT area 10 or the diode area 20. The emitter electrode 6 in the termination area 30 is continuously and integrally formed with the emitter electrode 6 in the IGBT area 10 or the diode area 20.

The terminal electrodes 6a are isolated from the emitter electrodes 6 and provided outward of the emitter electrodes 6. The terminal electrodes 6a are electrically connected to the p-type terminal well layers 31 and the n$^+$-type channel stopper layer 32 via the barrier metal 5 in the contact holes.

The semi-insulating film 33 is provided to electrically connect the emitter electrodes 6 with the terminal electrodes 6a. The semi-insulating film 33 may, for example, be semi-insulating silicon nitride (sin SiN).

The terminal protective film 34 covers the emitter electrodes 6, the terminal electrodes 6a, and the semi-insulating film 33. The terminal protective film 34 may be formed of, for example, polyimide.

The collector electrode 7 is provided on the p-type terminal collector layer 16a, i.e., on the second main surface of the semiconductor substrate. The collector electrode 7 in the termination area 30 is continuously and integrally formed with the collector electrodes 7 in the IGBT area 10 and the diode area 20.

(6) Method of Manufacturing Semiconductor Device

FIGS. 13 to 25 are illustrations of a method of manufacturing the semiconductor device according to Embodiment 1. FIGS. 13 to 19 are illustrations of a step of forming a structure on the first main surface side of the semiconductor device. FIGS. 22 to 25 are illustrations of a step of forming a structure on the second main surface side of the semiconductor device. In each drawing, a cross section of the boundary portion between the IGBT area 10 and the diode area 20, i.e., a cross section taken along the line segment E-E illustrated in FIG. 1 or 2, is illustrated.

Figure 13:
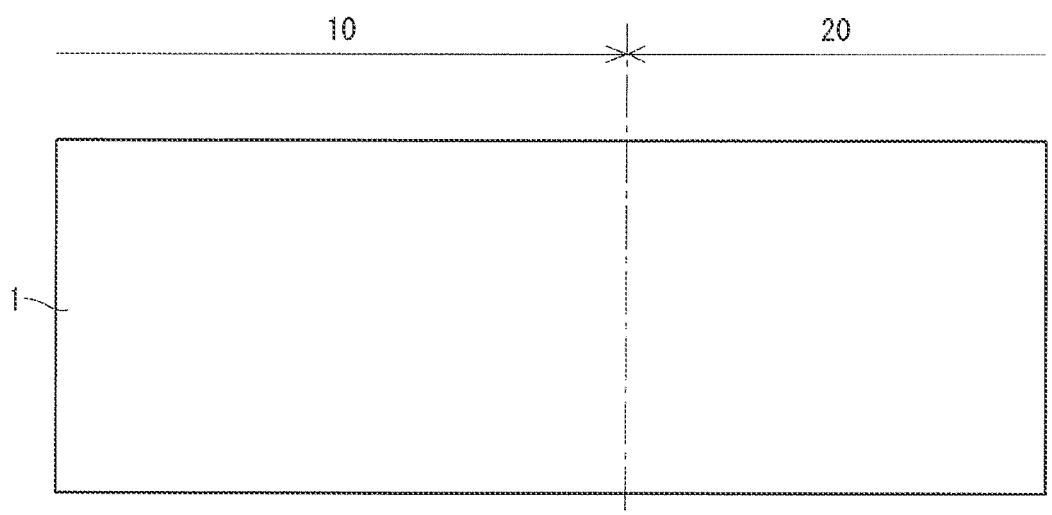
FIG. 13 is an illustration of a step of preparing a semiconductor substrate.

FIG. 13 is an illustration of a step of preparing a semiconductor substrate. In Embodiment 1, an n-type wafer that contains n-type impurities is prepared as the semiconductor substrate. In this step, the semiconductor substrate as a whole corresponds to the n$^-$-type drift layer 1. The concentration of the n-type impurities is appropriately selected depending on the breakdown voltage specification of the semiconductor device 100 or the semiconductor device 101. For example, when the semiconductor device has a breakdown voltage specification of 1200V, the concentration of the n-type impurities is adjusted such that the n$^-$-type drift layer 1 has a specific resistance of approximately 40 to 120 Ω·cm. Although the step of preparing an n-type wafer in which the semiconductor substrate as a whole is the n$^-$-type drift layer 1 is illustrated in FIG. 13, the step of preparing a semiconductor substrate is not limited thereto. For example, a semiconductor substrate that includes the n$^-$-type drift layer 1 may be prepared by a step of implanting n-type impurity ions from the first or second main surface of the semiconductor substrate and a step of diffusing the n-type impurities by heat treatment. Note that the semiconductor substrate may be a so-called floating zone (FZ) wafer manufactured by the FZ method, or may be a so-called magnetic field applied czochralki (MCZ) wafer manufactured by the MCZ method. As another alternative, the semiconductor substrate may be a wafer manufactured by sublimation or chemical vapor deposition (CVD).

Depending on the configuration of the semiconductor device 100 or the semiconductor device 101, IGBT areas 10 where IGBT cells will be arranged and diode areas 20 where diode cells will be arranged are defined in advance in the semiconductor substrate. Although not illustrated in FIG. 13, the termination area 30 where a breakdown-voltage sustaining structure will be formed is defined in advance around the IGBT areas 10 and the diode areas 20. The following description is principally given of the method of manufacturing each structure in the IGBT areas 10 and in the diode areas 20.

Figure 14:
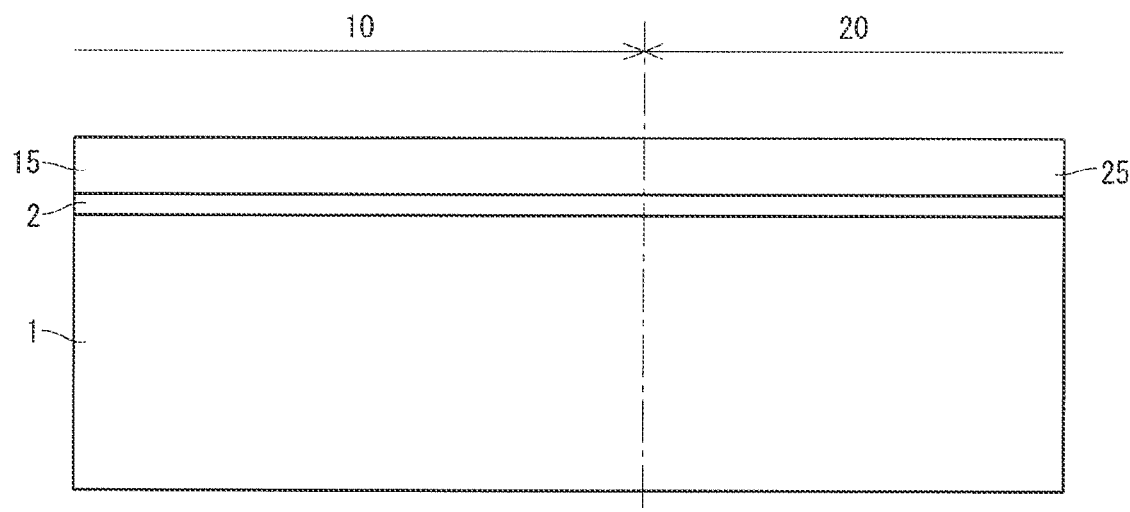
FIG. 14 is an illustration of a step of forming an n-type carrier storage layer, a p-type base layer, and a p-type anode layer.

FIG. 14 is an illustration of a step of forming the n-type carrier storage layer 2, the p-type base layer 15, and the p-type anode layer 25. N-type impurities for forming the n-type carrier storage layer 2 are implanted from the first main surface side of the semiconductor substrate into the surface layer of the n$^-$-type drift layer 1. The n-type impurities are, for example, phosphorus. P-type impurities for forming the p-type base layer 15 and the p-type anode layer 25 are implanted into the first main surface of the semiconductor substrate. The p-type impurities are, for example, boron. After the ion implantation, heat treatment is performed. The n-type impurities and the p-type impurities are diffused by the heat treatment, then the n-type carrier storage layer 2, the p-type base layer 15, and the p-type anode layer 25 are formed.

At the time of the ion implantation described above, a mask having openings in predetermined areas is formed on the first main surface of the semiconductor substrate. The n-type impurities and the p-type impurities are implanted into areas corresponding to the openings of the mask. The mask is formed by a step of coating a resist on the first main surface of the semiconductor substrate and a step of forming openings in predetermined areas of the resist by photolithography. Hereinafter, this processing for forming a mask having openings in predetermined areas is referred to as mask processing. The n-type impurities and the p-type impurities are implanted into predetermined areas through the mask processing. As a result, the n-type carrier storage layer 2, the p-type base layer 15, and the p-type anode layer 25 are selectively formed in the plane of the first main surface of the semiconductor substrate In the case where the p-type base layer 15 and the p-type anode layer 25 have the same configuration, i.e., the p-type base layer 15 and the p-type anode layer 25 have the same depth and the same p-type impurity concentration, the p-type impurities are implanted simultaneously. On the other hand, in the case where the p-type base layer 15 and the p-type anode layer 25 have different configurations, i.e., the p-type base layer 15 and the p-type anode layer 25 have different depths or different p-type impurity concentrations, p-type impurities for forming the p-type base layer 15 and p-type impurities for forming the p-type anode layer 25 are separately implanted through the mask processing. For example, the p-type impurities for forming the p-type base layer 15 are implanted through openings formed in the IGBT areas 10. The p-type impurities for forming the p-type anode layer 25 are implanted through openings formed in the diode areas 20.

Although not illustrated, the step of forming an FLR that includes a p-type terminal well layer 31 as a breakdown-voltage sustaining structure in the termination area 30 may be performed before the IGBT areas 10 and the diode areas 20 are processed, or may be performed simultaneously with the ion implantation of p-type impurities into the IGBT areas 10 or the diode areas 20. For example, in the case where the p-type terminal well layer 31 in the termination area 30 has the same configuration as the p-type anode layer 25, p-type impurities for forming the p-type terminal well layer 31 and p-type impurities for forming the p-type anode layer 25 are implanted simultaneously. Accordingly, the p-type terminal well layer 31 and the p-type anode layer 25 are formed at the same depth with the same p-type impurity concentration. In the case where the p-type terminal well layer 31 and the p-type anode layer 25 have different depths or different p-type impurity concentrations, the p-type impurities for forming the p-type terminal well layer 31 and the p-type impurities for forming the p-type anode layer 25 are separately implanted through the mask processing. Alternatively, even if the p-type terminal well layer 31 and the p-type anode layer 25 have different configurations. the p-type impurities for forming the p-type terminal well layer 31 and the p-type impurities for forming the p-type anode layer 25 may be implanted simultaneously. However, in this case, a mesh shape is formed in an opening of the mask in at least one of the area where the p-type terminal well layer 31 is formed and the area where the p-type anode layer 25. This mesh shape reduces the opening ratio and allows control of the amount of p-type impurities implanted into the semiconductor substrate. Although the relationship in formation of the p-type terminal well layer 31 and the p-type anode layer 25 has been described above, the same also applies to the relationship in formation of the p-type terminal well layer 31 and the p-type base layer 15. Moreover, the p-type impurities for forming the p-type terminal well layer 31, the p-type impurities for forming the p-type base layer 15, and the p-type impurities for forming the p-type anode layer 25 may be implanted simultaneously. The n-type carrier storage layer 2 and the p-type base layer 15 are formed in the IGBT areas 10 and connected to the p-type terminal well layer 31 in the termination area 30. The n-type carrier storage layer 2 and the p-type anode layer 25 are formed in the diode areas 20 and connected to the p-type terminal well layer 31 in the termination area 30.

Figure 15:
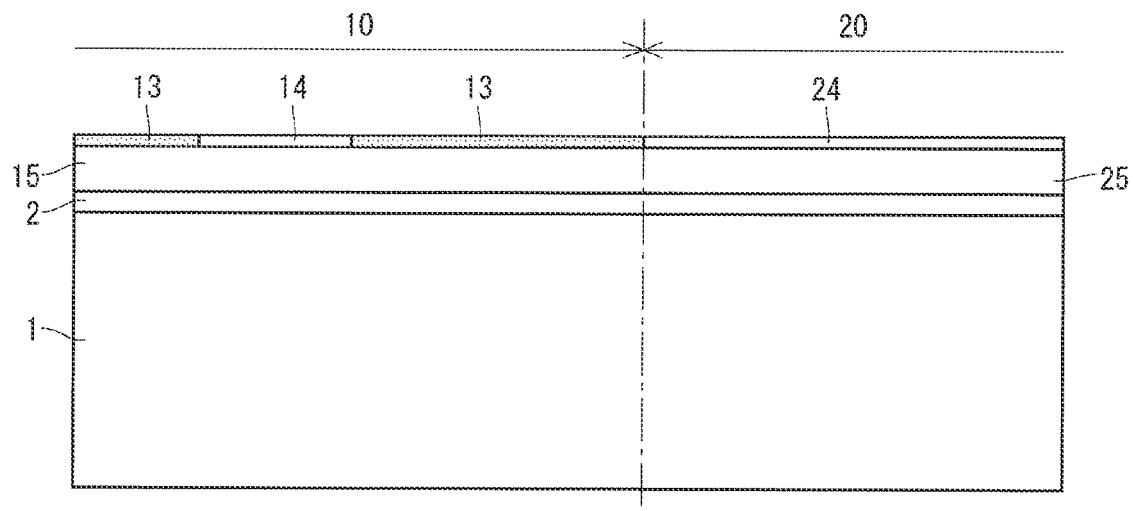
FIG. 15 is an illustration of a step of forming an $n^+$-type source layer, a $p^+$-type contact layer, and a $p^+$-type contact layer.

FIG. 15 is an illustration of a step of forming the $n^+$-type source layer 13, the $p^+$-type contact layer 14, and the $p^+$-type contact layer 24. N-type impurities for forming the $n^+$-type source layer 13 are implanted from the first main surface side of the semiconductor substrate into the surface layer of the p-type base layer 15. The n-type impurities are, for example, arsenic or phosphorus. At this time, the openings of the mask are arranged such that the n-type impurities are implanted only into predetermined areas of the IGBT areas 10. Through this mask processing, the $n^+$-type source layer 13 is selectively formed in the surface layer of the p-type base layer 15 in the IGBT areas 10.

Similarly, p-type impurities for forming the $p^+$-type contact layer 14 and p-type impurities for forming the $p^+$-type contact layer 24 are implanted from the first main surface side of the semiconductor substrate. The p-type impurities are, for example, boron or aluminum. At this time, the openings of the mask are arranged such that the p-type impurities are implanted only into predetermined areas of the IGBT areas 10 and the diode areas 20. Through this mask processing, the $p^+$-type contact layer 14 and the $p^+$-type contact layer 24 are selectively formed in the surface layer of the p-type base layer 15 in the IGBT areas 10 and the diode areas 20, respectively.

FIG. 16 is an illustration of a step of forming trenches 8. The trenches 8 are formed by a step of depositing a material for hard mask on the first main surface of the semiconductor substrate, a step of forming a hard mask having openings in portions corresponding to the trenches 8 by photolithography, and a step of etching the semiconductor substrate via the hard mask. The hard mask is, for example, a thin film such as $SiO_2$.

The trenches 8 in the IGBT areas 10 extend from the first main surface of the semiconductor substrate through the p-type base layer 15 and the n-type carrier storage layer 2 to the $n^-$-type drift layer 1. Some of the trenches 8 formed in the IGBT areas 10 penetrate also through the $n^+$-type source layer 13, and other some of the trenches 8 penetrate also through the $p^+$-type contact layer 14. The trenches 8 in the diode areas 20 extend from the first main surface of the semiconductor substrate through the p-type anode layer 25 and the n-type carrier storage layer 2 to the $n^-$-type drift layer 1. In the areas in which the $p^+$-type contact layer 24 is provided as a surface layer of the semiconductor substrate, the trenches 8 penetrate also through the $p^+$-type contact layer 24.

In FIG. 16, the trenches 8 in the IGBT areas 10 have the same pitch as the trenches 8 in the diode areas 20. Alternatively, the pitch of the trenches 8 in the IGBT areas 10 may be different from the pitch of the trenches 8 in the diode areas 20. The pitches of the trenches 8 may be appropriately changed depending on the mask pattern in the mask processing.

Figure 17:
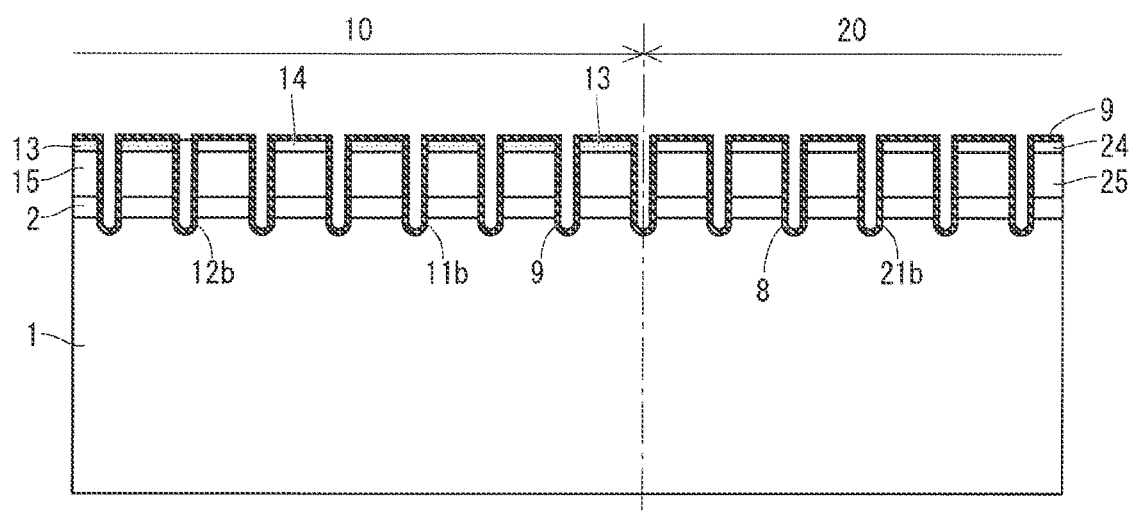
FIG. 17 is an illustration of a step of forming an oxide film.

FIG. 17 is an illustration of a step of forming an oxide film 9. The semiconductor substrate is heated in an atmosphere containing oxygen. Accordingly, the oxide film 9 is formed on the inner walls of the trenches 8 and on the first main surface of the semiconductor substrate. In the IGBT areas 10, the oxide film 9 formed on the inner walls of the trenches 8 that penetrate through the $n^+$-type source layer 13 corresponds to the gate trench insulation film 11b. Similarly, in the IGBT areas 10, the oxide film 9 formed on the inner walls of the trenches 8 that penetrate through the $p^+$-type contact layer 14 corresponds to the dummy trench insulation film 12b. Note that the oxide film 9 formed on the first main surface of the semiconductor substrate is removed in a subsequent step.

Figure 18:
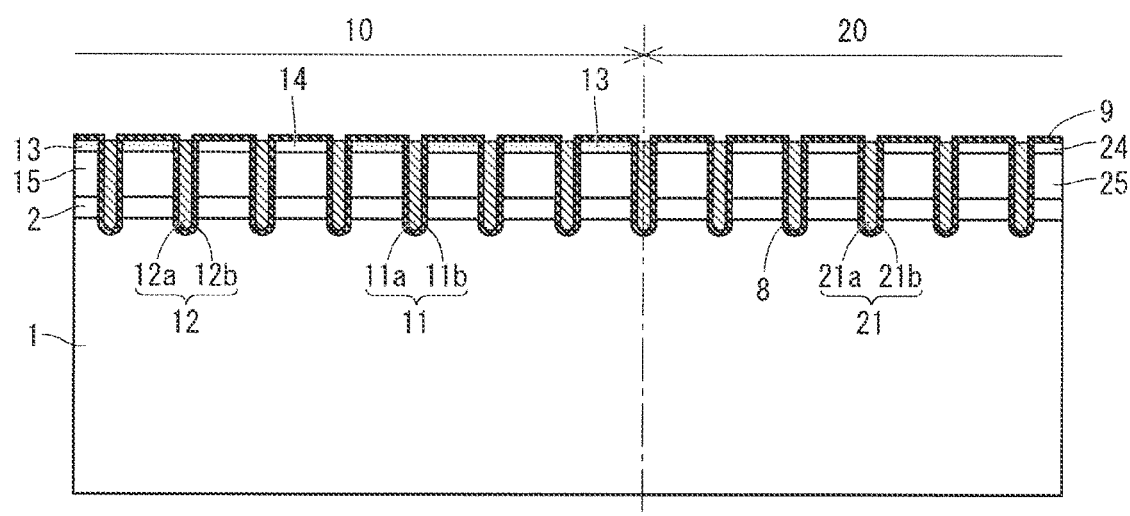
FIG. 18 is an illustration of a step of forming gate trench electrodes, dummy trench electrodes, and diode trench electrodes.

FIG. 18 is an illustration of a step of forming the gate trench electrodes 11a, the dummy trench electrodes 12a, and the diode trench electrodes 21a. Polysilicon doped with n- or p-type impurities is deposited on the insides of the trenches 8 by, for example, chemical vapor deposition (CVD). As a result, the gate trench electrodes 11a are formed on the insides of trenches 8 via the gate trench insulation film 11b, the dummy trench electrodes 12a are formed on the insides of trenches 8 via the dummy trench insulation film 12b, and the diode trench electrodes 21a are formed on the insides of trenches 8 via the diode trench insulation film 21b.

FIG. 19 is an illustration of a step of forming the insulating material film 4a. The insulating material film 4a is formed on the first main surface of the semiconductor substrate. The insulating material film 4a contains, for example, $SiO_2$.

Figure 20:
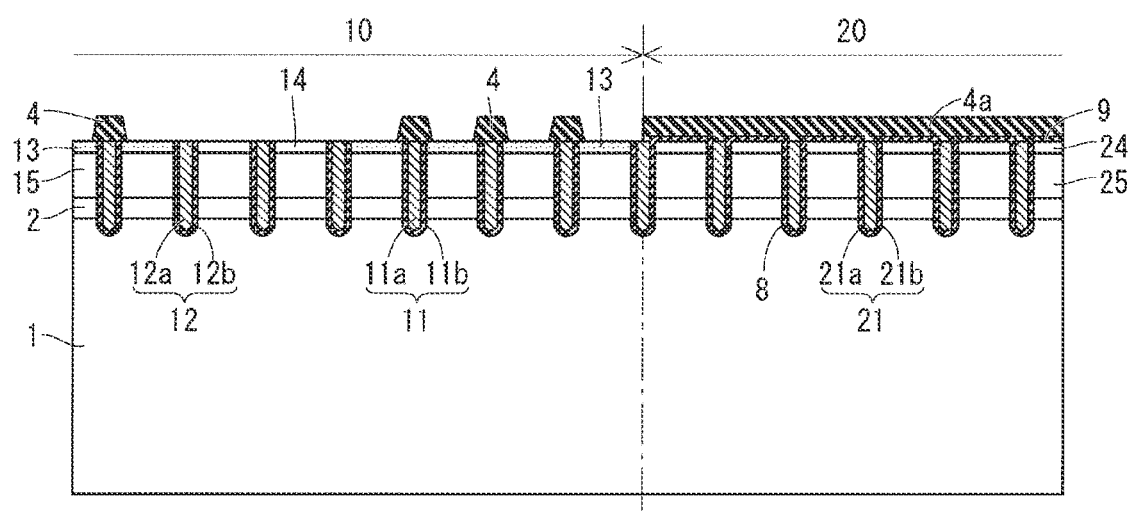
FIG. 20 is an illustration of a step of forming contact holes in the IGBT area.

FIG. 20 is an illustration of a step of forming contact holes in the IGBT areas 10. After the insulating material film 4a is subjected to mask processing, the insulating material film 4a and the oxide film 9 are etched. The etching may, for example, be dry etching. The dry etching is conducted in a gas atmosphere containing fluorocarbon. Examples of the gas include $C_5F_8$, $C_4F_8$, $CHF_3$, $CF_4$, $C_4F_6$, $C_3F_8$, and $C_2F_6$. The contact holes are formed in positions corresponding to the positions of the $n^+$-type source layer 13, the $p^+$-type contact layer 14, and the dummy trench gates 12 in the IGBT area 10, and are not formed in the diode areas 20. Through this step, the $n^+$-type source layer 13, the $p^+$-type contact layer 14, and the dummy trench electrode 12a are exposed. The insulating material film 4a remains on the areas covered with the mask, i.e., on the active trench gates 11 in the IGBT areas 10 and forms the interlayer insulation film 4.

FIG. 21 is an illustration of a step of forming contact holes in the diode areas 20. To be more specific, FIG. 21 is an illustration of a step of exposing the upper side walls 8a of the trenches 8 in the diode areas 20. After the insulating material film 4a is subjected to mask processing, the insulating material film 4a and the oxide film 9 are etched. At this time, the entire surface of the IGBT area 10 in which the interlayer insulation film 4 has already been formed is covered with a mask. This etching may, for example, be dry etching. The dry etching is conducted in a gas atmosphere containing fluorocarbon. The contact holes are formed at the positions of the $p^+$-type contact layer 24 and the diode trench gates 21.

During the etching of the insulating material film 4a in the diode areas 20, an upper portion of the diode trench insulation film 21b on the dummy trench gates 12 that are not covered with the mask is also etched. As a result, the upper side walls 8a of the trenches 8 are exposed. Also, clearance is created between the upper side walls 8a of the trenches 8 and the diode trench electrode 21a. The diode trench insulation film 21b remains on the lower side walls 8b and bottoms 8c of the trenches 8.

Figure 22:
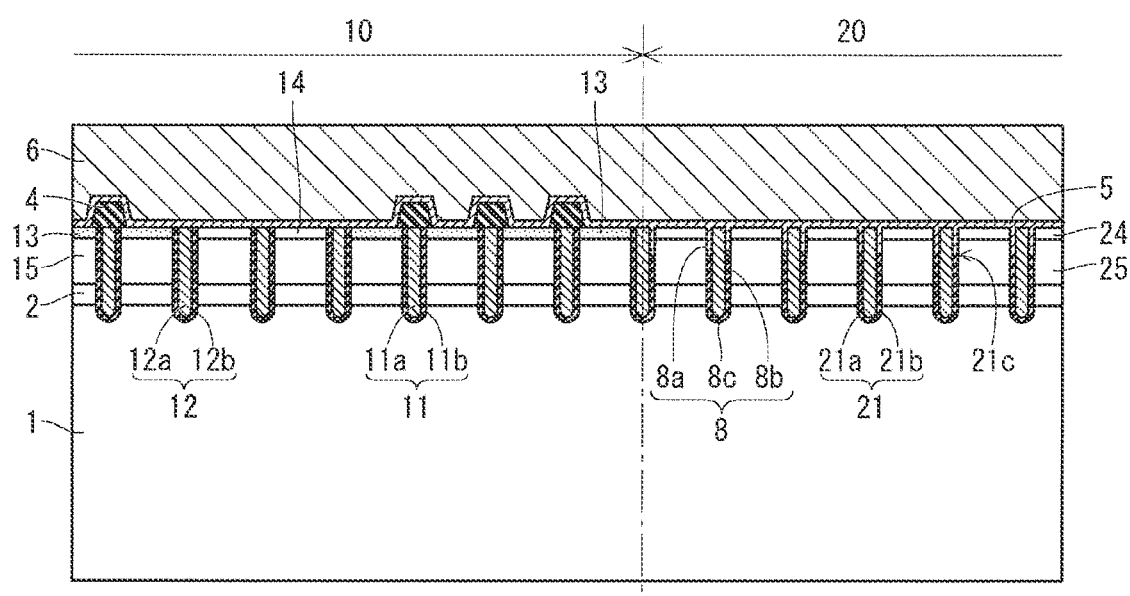
FIG. 22 is an illustration of a step of forming a barrier metal and an emitter electrode.

FIG. 22 is an illustration of a step of forming the barrier metal 5 and the emitter electrode 6. The barrier metal 5 is formed on the first main surface of the semiconductor substrate and on the interlayer insulation film 4. The barrier metal 5 is also deposited in the clearance between the upper side walls 8a of the trenches 8 and the diode trench electrode 21a. The barrier metal 5 may, for example, be titanium-containing metal such as Ti, TiN, or TiSi. The barrier metal 5 is formed by physical vapor deposition (PVD) or CVD. The barrier metal 5 is in contact with the side surfaces of the p-type anode layer 25 and the p$^+$-type contact layer 24 that are exposed from the upper side walls 8a of the trenches 8. The barrier metal 5 is also in contact with the upper surfaces and side surfaces of the diode trench electrodes 21a.

Moreover, the emitter electrode 6 is formed on the barrier metal 5. The emitter electrode 6 contains, for example, an aluminum silicon alloy (Al—Si based alloy). The emitter electrode 6 is formed by sputtering or PVD such as vapor deposition. Alternatively, a nickel alloy (Ni based alloy) may be formed on an aluminum silicon alloy by electroless plating or electroplating as the emitter electrode 6. The plating methods allow easy formation of a thick metal film. Since the thicker emitter electrode 6 has a higher heat capacity, the heat resistance of the emitter electrode 6 improves. Note that in the case where a nickel alloy is further formed on the aluminum silicon alloy by plating processing, the plating processing may be conducted after the second main surface side of the semiconductor substrate is processed.

FIG. 23 is an illustration of a step of reducing the thickness of the semiconductor substrate. The second main surface of the semiconductor substrate is grinded so as to reduce the thickness of the semiconductor substrate to a predetermined thickness according to the design of the semiconductor device. The thickness of the semiconductor substrate after grinding is, for example, greater than or equal to 80 μm and less than or equal to 200 μm.

Figure 24:
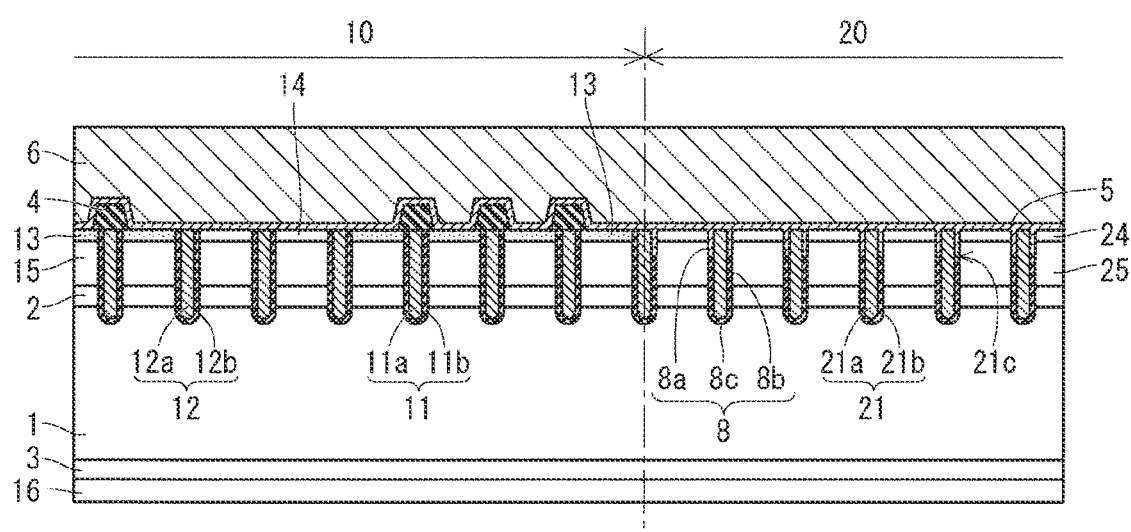
FIG. 24 is an illustration of a step of forming an n-type buffer layer and a p-type collector layer.

FIG. 24 is an illustration of a step of forming the n-type buffer layer 3 and the p-type collector layer 16. N-type impurities for forming the n-type buffer layer 3 are implanted from the second main surface side of the semiconductor substrate into the surface layer of the n$^-$-type drift layer. As the n-type impurities, phosphorus or proton may be implanted, for example. Alternatively, both phosphorus and proton may be implanted, for example.

Proton is implanted from the second main surface of the semiconductor substrate to a deep position with a relatively low acceleration energy. The implantation depth of proton is relatively easily controlled by changing the acceleration energy. Thus, if proton is implanted multiple times while changing the acceleration energy, the n-type buffer layer 3 to be formed has a greater width in the thickness direction of the semiconductor substrate than an n-type buffer layer 3 containing phosphorus.

Phosphorus serving as n-type impurities has a higher activation ratio than proton. If the n-type buffer layer 3 contains phosphorus, it is possible to more reliably reduce the occurrence of punch-through due to expansion of a depletion layer, even if the semiconductor substrate has a reduced thickness. In order to further reduce the thickness of the semiconductor substrate, the n-type buffer layer 3 preferably contains both proton and phosphorus. In that case, proton is implanted deeper than phosphorus from the second main surface of the semiconductor substrate.

Moreover, p-type impurities for forming the p-type collector layer 16 are implanted from the second main surface side of the semiconductor substrate. The p-type impurities may, for example, be boron. After the ion implantation, the second main surface of the semiconductor substrate is irradiated with laser. This laser annealing activates the implanted boron and forms the p-type collector layer 16.

During this laser annealing, phosphorus implanted to a relatively shallow position in the n-type buffer layer 3 from the second main surface of the semiconductor substrate is also activated simultaneously. On the other hand, proton is activated at a relatively low annealing temperature of approximately 380° C. to 420° C. Thus, after the proton implantation, it is preferable that the semiconductor substrate is not heated to a temperature higher than the range of temperatures from 380° C. to 420° C. in steps other than the proton activation step. The laser annealing heats only the vicinity of the second main surface to a high temperature. Thus, laser annealing is effective in activating n- or p-type impurities after the proton implantation.

The n-type buffer layer 3 may be formed in the IGBT areas 10, the diode areas 20, and the termination area 30, or may be formed only in the IGBT areas 10 or in the diode areas 20. The p-type collector layer 16 is also formed in the termination area 30. Here, the p-type collector layer 16 in the termination area 30 corresponds to the p-type terminal collector layer 16a.

Figure 25:
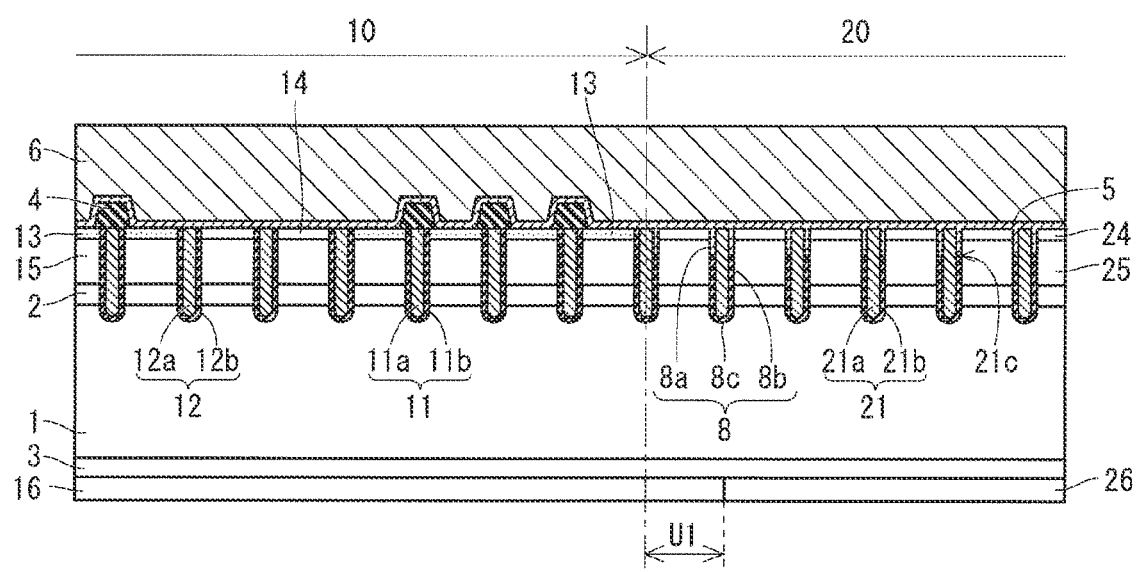
FIG. 25 is an illustration of a step of forming an n+-type cathode layer.

FIG. 25 is an illustration of a step of forming the n$^+$-type cathode layer 26. N-type impurities for forming the n$^+$-type cathode layer 26 are implanted into the second main surface of the semiconductor substrate in the diode areas 20. The n-type impurities may, for example, be phosphorus. The n-type impurities are selectively implanted by mask processing such that the boundary between the p-type collector layer 16 and the n$^+$-type cathode layer 26 is located at a position that is spaced toward the diode areas 20 by the distance U1 from the boundary between the IGBT areas 10 and the diode areas 20.

The amount of the n-type impurities for forming the n$^+$-type cathode layer 26 is greater than the amount of the p-type impurities contained in the p-type collector layer 16. The n-type impurities for forming the n$^+$-type cathode layer 26 are implanted into an area in which the p-type collector layer 16 has been formed. That is, the implantation of the n-type impurities is required to change the p-type semiconductor into an n-type semiconductor. Thus, n-type impurities are implanted such that the n-type impurity concentration is higher than the p-type impurity concentration in all over the area in which the n$^+$-type cathode layer 26 is formed.

Although the example in which the p-type collector layer 16 and the n$^+$-type cathode layer 26 have the same depth from the second main surface is illustrated in FIG. 25, the depth relationship between the p-type collector layer 16 and the n$^+$-type cathode layer 26 is not limited thereto. The n$^+$-type cathode layer 26 may have a greater depth than the p-type collector layer 16.

FIG. 26 is an illustration of a step of forming the collector electrode 7. The collector electrode 7 is formed on the second main surface in the IGBT areas 10, the diode areas 20, and the termination area 30. The collector electrode 7 may be formed on the entire second main surface of the semiconductor substrate.

The collector electrode 7 contains, for example, an aluminum silicon alloy and titanium. The collector electrode 7 is formed by sputtering or PVD such as vapor deposition. The collector electrode 7 may also have a structure in which a plurality of metal layers, such as aluminum silicon alloy, titanium, nickel, and gold, are laminated. Alternatively, a metal film may further be formed as the collector electrode 7 by electroless plating or electroplating, on another metal film formed by PVD.

In Embodiment 1, a plurality of semiconductor devices 100 or a plurality of semiconductor devices 101 are manufactured in a matrix on a single semiconductor substrate through the manufacturing steps described above. The semiconductor devices are cut out into individual pieces by laser dicing or blade dicing. Accordingly, the semiconductor device 100 or the semiconductor device 101 is completed.

(7) Function of Upper Side Walls of Trenches

Figure 27:
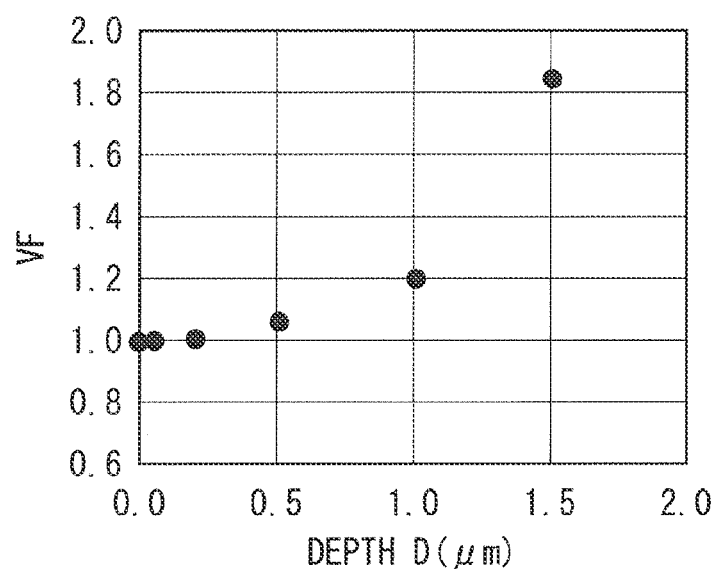
FIG. 27 is an illustration of a relationship between the position of the upper end of a diode trench insulation film and a forward-voltage drop in diodes.

FIG. 27 is an illustration of a relationship between a forward voltage drop (VF) of the diodes and the position of the upper end 21c of the diode trench insulation film 21b. That is, FIG. 27 is an illustration of the relationship between the forward voltage drop (VF) and the depth D from the first main surface of the semiconductor substrate to the upper end 21c of the diode trench insulation film 21b. The forward voltage drop (VF) is indicated by a normalized value.

Figure 28:
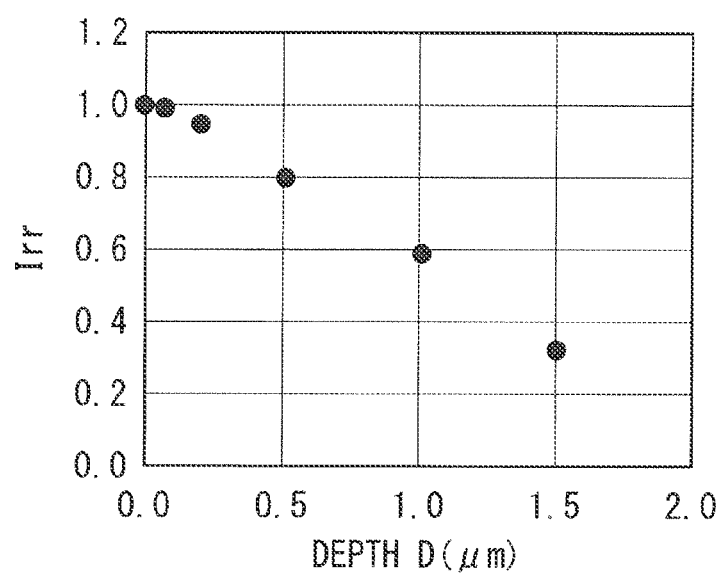
FIG. 28 is an illustration of a relationship between recovery current and the position of the upper end of the diode trench insulation film.

FIG. 28 is an illustration of a relationship between recovery current (Irr) and the position of the upper end 21c of the diode trench insulation film 21b. That is, FIG. 28 is an illustration of the relationship between the recovery current (Irr) and the depth D. The recovery current (Irr) is indicated by a normalized value.

Figure 29:
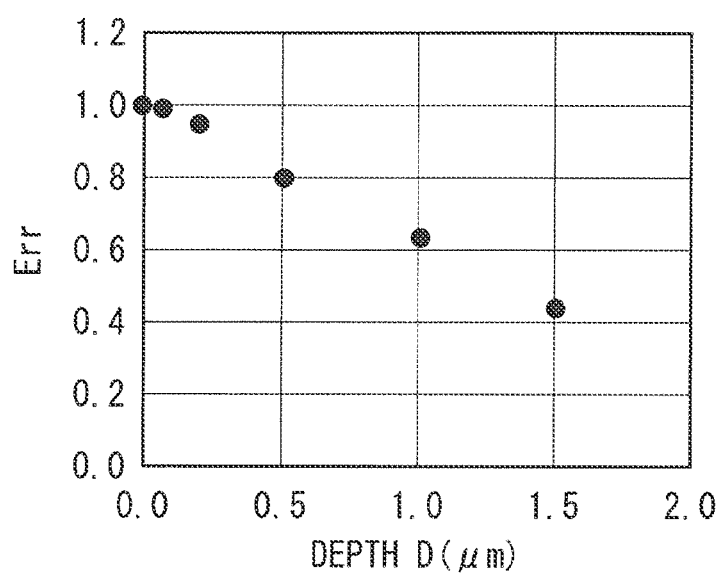
FIG. 29 is an illustration of a relationship between recovery loss and the position of the upper end of the diode trench insulation film.

FIG. 29 is an illustration of a relationship between recovery loss (Err) and the position of the upper end 21c of the diode trench insulation film 21b. That is, FIG. 29 is an illustration of the relationship between the recovery loss (Err) and the depth D. The recovery loss (Err) is indicated by a normalized value.

As the depth D increases, the forward voltage drop (VF) increases, and the recovery current (Irr) and the recovery loss (Err) decrease. For example, the forward voltage drop (VF) when D=0.5 μm is greater by 6% than the forward voltage drop (VF) when D=0 μm. On the other hand, the recovery current (Irr) and the recovery loss (Err) decrease by 19%. When D≥0.5 μm, the recovery current (Irr) and the recovery loss (Err) decrease.

In summary, the semiconductor device according to Embodiment 1 includes a semiconductor substrate, a first semiconductor layer of a first conductivity type, a second semiconductor layer of a second conductivity type, the diode trench gates 21, and an electrode layer. In Embodiment 1, the first semiconductor layer of the first conductivity type corresponds to the p-type anode layer 25, and the second semiconductor layer of the second conductivity type corresponds to the n-type semiconductor layer that includes the n-type carrier storage layer 2 and the n⁻-type drift layer 1. The electrode layer according to Embodiment 1 corresponds to the barrier metal 5. The p-type anode layer 25 is provided as a surface layer on the first main surface side of the semiconductor substrate. The n-type carrier storage layer 2 and the n⁻-type drift layer 1 are provided below the p-type anode layer 25. The diode trench gates 21 include the diode trench insulation film 21b and the diode trench electrodes 21a. The diode trench insulation film 21b is formed on the inner walls of the trenches 8 that extend from the first main surface of the semiconductor substrate through the p-type anode layer 25 to the n-type semiconductor layer (n⁻-type drift layer 1). The diode trench electrodes 21a are provided inside the trenches 8. The barrier metal 5 covers the surface layer of the semiconductor substrate. The diode trench insulation film 21b is formed along, out of the inner walls of the trenches 8, the bottoms 8c and the lower side walls 8b that is located below the upper side walls 8a located on the upper end sides of the trenches 8. The barrier metal 5 further convers the upper side walls 8a of the trenches 8. The p-type anode layer 25 is in contact with the barrier metal 5 on the upper side walls 8a of the trenches 8. The electrode layer may be the emitter electrode 6, instead of the barrier metal 5. The electrode layer is not limited to the barrier metal 5 and the emitter electrode 6 and serves as a metal layer that is in ohmic contact with the p-type anode layer 25 on the upper side walls 8a.

This configuration increases the area of contact between the p-type anode layer 25 and the barrier metal 5 and accordingly increases the number of carriers flowing into the emitter electrode 6. This lowers the carrier density in the vicinity of the p-type anode layer 25 and suppresses IE effects. As a result, the recovery current (Irr) and the recovery loss (Err) decrease. Even in high-speed applications that place emphasis on the switching loss of transistors, power loss, i.e., energy loss, decreases. Although the example in which the first conductivity type is a p-type and the second conductivity type is an n-type is described in Embodiment 1, the first conductivity type may be an n-type and the second conductivity type may be a p-type. In that case, the first semiconductor layer of the first conductivity type becomes an n-type cathode layer.

In Embodiment 1, the depth D from the first main surface of the semiconductor substrate to the upper end 21c of the diode trench insulation film 21b is greater than or equal to 0.5 μm.

This configuration further lowers the carrier density in the vicinity of the p-type anode layer 25. Accordingly, the effect of reducing the recovery current (Irr) appears markedly.

In Embodiment 1, the barrier metal 5 is formed by CVD.

In this manufacturing method, the barrier metal 5 is favorably embedded in the clearance between the upper side walls 8a of the trenches 8 and the diode trench electrodes 21a.

Variation 1 of Embodiment 1

Figure 30:
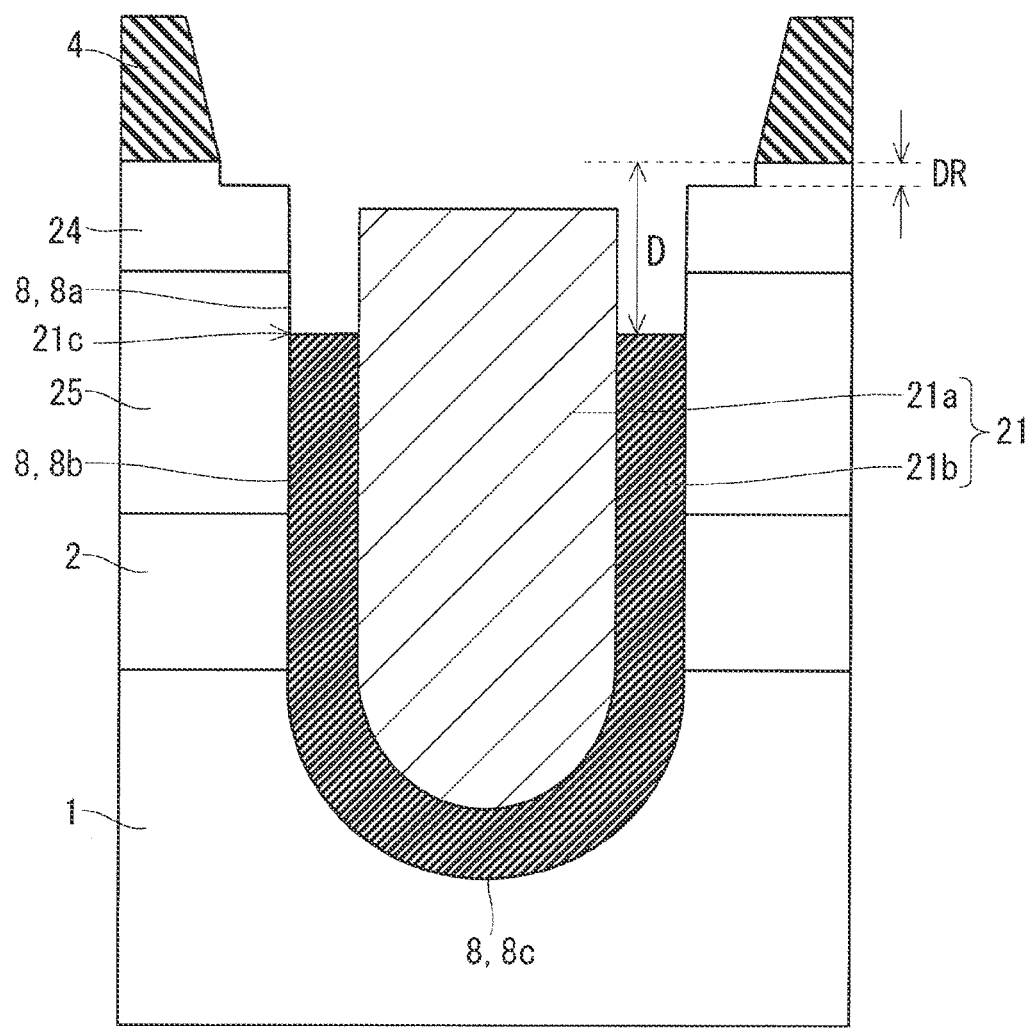
FIG. 30 is an illustration of a step of exposing an upper side wall of a trench.

FIG. 30 is an illustration of a method of manufacturing a semiconductor device according to Variation 1 of Embodiment and specifically a step of exposing the upper side walls 8a of the trenches 8.

When the insulating material film 4a of the interlayer insulation film 4 and the oxide film 9 are etched, recesses are formed at the positions of contact holes in the first main surface of the semiconductor substrate. The contact holes are formed by dry etching. The recesses are formed by over-etching during the dry etching.

The dry etching is conducted in a gas atmosphere containing fluorocarbon. Examples of the gas include $C_5F_8$, $C_4F_8$, $CHF_3$, $CF_4$, $C_4F_6$, $C_3F_8$, and $C_2F_6$.

In order to expose the upper side walls 8a of the trenches 8 and to achieve a predetermined depth DR of the recesses, the etch rate of the oxide film 9 needs to be higher than the etch rates of the p-type anode layer 25 and the p⁺-type contact layer 24.

In particular, in order to form the upper end 21c of the diode trench insulation film 21b at a position deeper than the depth of the recesses, the selection ratio of the etch rate of the oxide film 9 and the etch rate of the p-type anode layer 25 or the p⁺-type contact layer 24 is preferably higher than or equal to 11.0. Etching conditions for the selection ratio higher than or equal to 11.0 realize the structure with RD of 50 nm and D≥0.5 μm.

Thereafter, the barrier metal 5 is formed in the recesses. The recesses reduce contact resistance between the barrier metal 5 and the p-type anode layer 25 and contact resistance between the barrier metal 5 and the p⁺-type contact layer 24. Even if the barrier metal 5 is replaced by the emitter electrode 6, the same effect as that described above can be achieved.

Variation 2 of Embodiment 1

Figure 32:
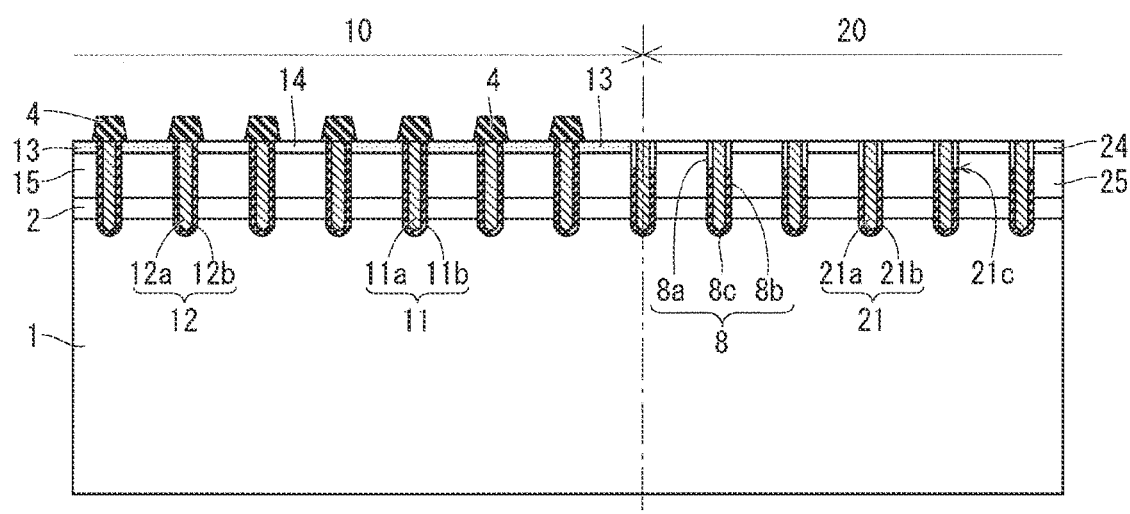
FIG. 32 is an illustration of a step of forming contact holes.
Figure 33:
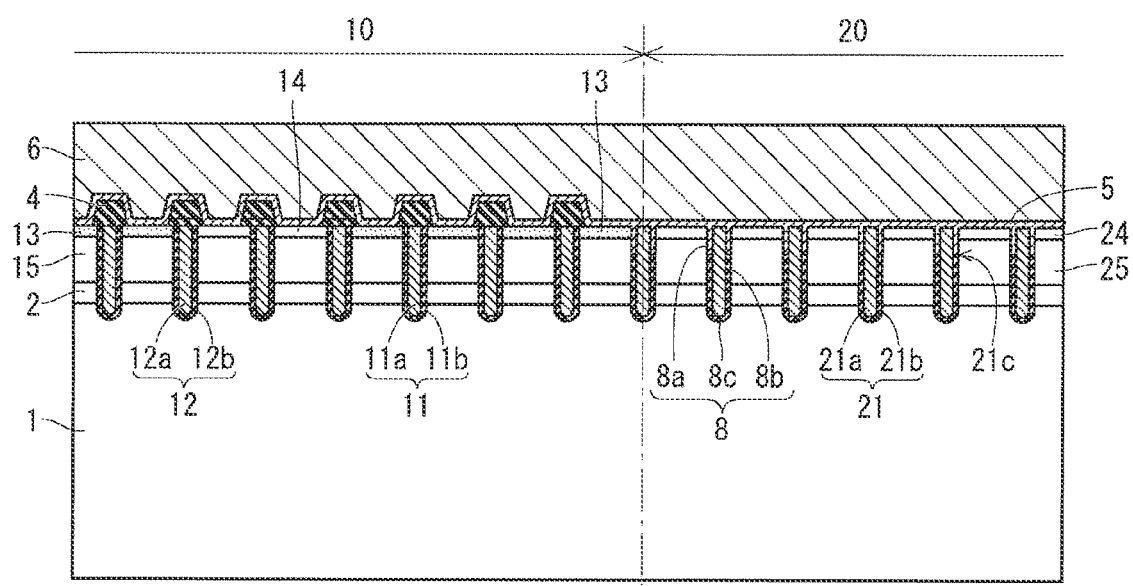
FIG. 33 is an illustration of a step of forming a barrier metal and a emitter electrode.

FIGS. 31 to 33 are illustrations of a method of manufacturing a semiconductor device according to Variation 2 of Embodiment 1.

FIG. 31 is an illustration of a step of forming the insulating material film 4a. The step of forming the insulating material film 4a is the same as the step described in Embodiment 1.

FIG. 32 is an illustration of a step of forming contact holes. To be more specific, FIG. 32 is an illustration of a step of forming the interlayer insulation film 4 and exposing the upper side walls 8a of the trenches 8 in the diode areas 20. After the insulating material film 4a is subjected to mask processing, the insulating material film 4a and the oxide film 9 are etched. The contact holes are formed at the positions of the n$^+$-type source layer 13, the p$^+$-type contact layer 14, the p$^+$-type contact layer 24, and the diode trench gates 21. Through this step, the n$^+$-type source layer 13, the p$^+$-type contact layer 14, the p$^+$-type contact layer 24, and the diode trench electrodes 21a are exposed. Also, the interlayer insulation film 4 is formed on the area covered with the mask, i.e., on the active trench gates 11 and the dummy trench gates 12 in the IGBT areas 10.

During the etching of the insulating material film 4a, the upper portion of the diode trench insulation film 21b on the diode trench gates 21, which is not covered with the mask, is also etched. As a result, the upper side walls 8a of the trenches 8 are exposed. Also, clearance is created between the upper side walls 8a of the trenches 8 and the diode trench electrode 21a. The diode trench insulation film 21b remains on the lower side walls 8b and bottoms 8c of the trenches 8.

FIG. 33 is an illustration of a step of forming the barrier metal 5 and the emitter electrode 6. The barrier metal 5 is formed on the first main surface of the semiconductor substrate and on the interlayer insulation film 4. The barrier metal 5 is also deposited on the clearance between the upper side walls 8a of the trenches 8 and the diode trench electrode 21a. The barrier metal 5 is in contact with the side surfaces of the p-type anode layer 25 and the p$^+$-type contact layer 24 that are exposed from the upper side walls 8a of the trenches 8. The barrier metal 5 is also in contact with the upper surfaces and side surfaces of the diode trench electrodes 21a. Then, the emitter electrode 6 is further formed on the barrier metal 5.

This semiconductor device can also achieve the same effects as those described in Embodiment 1.

Variation 3 of Embodiment 1

FIGS. 34 to 36 are illustrations of a method of manufacturing a semiconductor device according to Variation 3 of Embodiment 1.

FIG. 34 is an illustration of a step of forming the insulating material film 4a. The step of forming the insulating material film 4a is the same as that described in Embodiment 1.

FIG. 35 is an illustration of a step of forming contact holes. To be more specific, FIG. 35 illustrates a step of forming the interlayer insulation film 4 and exposing the upper side walls 8a of the trenches 8 in the diode areas 20. After the insulating material film 4a is subjected to mask processing, the insulating material film 4a and the oxide film 9 are etched. The contact holes are formed at the positions of the n$^+$-type source layer 13, the p$^+$-type contact layer 14, the p$^+$-type contact layer 24, the dummy trench gates 12, and the diode trench gates 21. Through this step, the n$^+$-type source layer 13, the p$^+$-type contact layer 14, the p$^+$-type contact layer 24, the dummy trench electrodes 12a, and the diode trench electrodes 21a are exposed. Also, the interlayer insulation film 4 is formed on the area covered with the mask, i.e., on the active trench gates 11 in the IGBT areas 10.

During the etching of the insulating material film 4a, the upper portions of the diode trench insulation film 21b and the dummy trench insulation film 12b, which are not covered with the mask, are also etched. As a result, clearance is created not only between the upper side walls 8a of the trenches 8 and the diode trench electrodes 21a, but also between the upper side walls 8a and the dummy trench electrodes 12a.

FIG. 36 is an illustration of a step of forming the barrier metal 5 and the emitter electrode 6. The barrier metal 5 is formed on the first main surface of the semiconductor substrate and on the interlayer insulation film 4. The barrier metal 5 is deposited not only on the clearance between the upper side walls 8a of the trenches 8 and the diode trench electrodes 21a, but also on the clearance between the upper side walls 8a and the dummy trench electrodes 12a. The barrier metal 5 is in contact with the side surfaces of the p-type anode layer 25 and the p$^+$-type contact layer 24 that are exposed from the upper side walls 8a of the trenches 8. The barrier metal 5 is also in contact with the upper surfaces and side surfaces of the diode trench electrodes 21a. The emitter electrode 6 is further formed on the barrier metal 5.

The semiconductor device as described above can also achieve the same effects as those described in Embodiment 1.

Embodiment 2

A semiconductor device and a method of manufacturing a semiconductor device according to Embodiment 2 will be described. Embodiment 2 is a subordinate concept of Embodiment 1. In Embodiment 2, constituent elements that are similar to those described in Embodiment 1 are given the same reference signs, detailed descriptions thereof shall be omitted.

Figure 37:
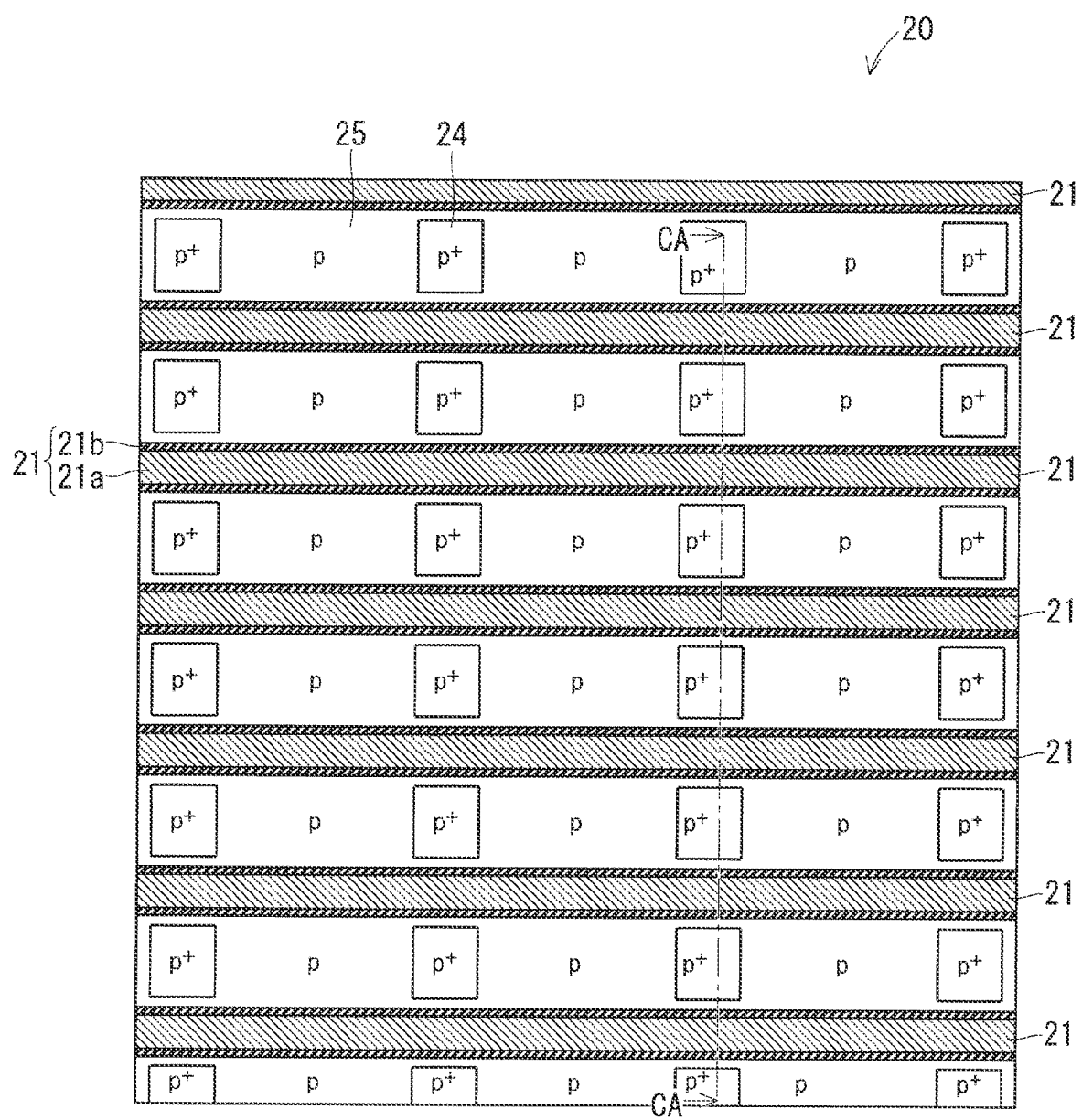
FIG. 37 is a partial enlarged plan view illustrating a configuration of a diode area according to Embodiment 2.

FIG. 37 is a partial enlarged plan view illustrating a configuration of one diode area 20 in the semiconductor device according to Embodiment 2. FIG. 37 is an enlarged view of the area 83 in the semiconductor device 100 illustrated in FIG. 1 or in the semiconductor device 101 illustrated in FIG. 2.

As in Embodiment 1, p$^+$-type contact layers 24 are selectively provided on the upper surface side of the p-type anode layer 25. However, in plan view, a plurality of contact areas in which the p$^+$-type contact layer 24 is provided are surrounded by the p-type anode layer 25.

Figure 38:
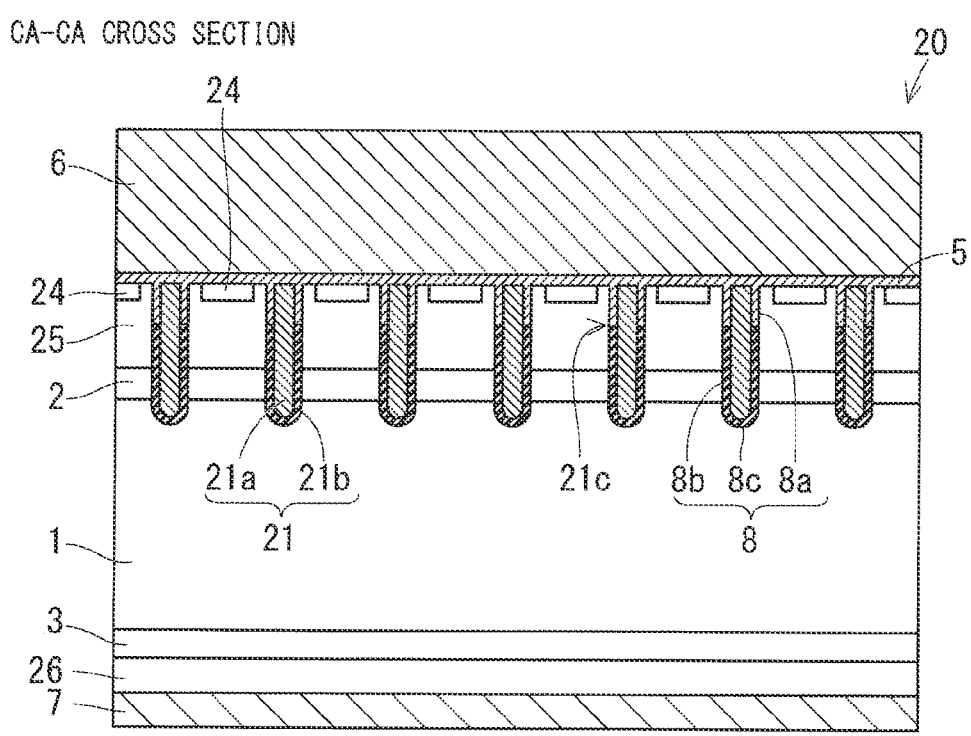
FIG. 38 is a sectional view illustrating the configuration of the diode area according to Embodiment 2.

FIG. 38 is a sectional view illustrating a configuration of one diode area 20 in the semiconductor device according to Embodiment 2. FIG. 38 is an illustration of a cross section taken along a line segment CA-CA illustrated in FIG. 37.

In plan view, diode trench gates 21 are arranged between the plurality of contact areas. The upper side walls 8a of the trenches 8 are arranged so as not to penetrate through the p$^+$-type contact layer 24 in the contact areas. That is, the trenches 8 are provided to penetrate through the p-type anode layer 25 on the first main surface of the semiconductor substrate. Thus, the p$^+$-type contact layers 24 are not exposed from the upper side walls 8a, and only the p-type anode layer 25 is exposed from the upper side walls 8a.

The p$^+$-type contact layers 24 having a higher impurity concentration than the p-type anode layer 25 are not in contact with the barrier metal 5 (or the emitter electrode 6)

on the upper side walls 8a of the trenches 8. This reduces the amount of holes injected from the p⁺-type contact layer 24. As a result, the recovery current (Irr) and the recovery loss (Err) decrease.

Embodiment 3

A semiconductor device and a method of manufacturing a semiconductor device according to Embodiment 3 will be described. Embodiment 3 is a subordinate concept of Embodiment 1. In Embodiment 3, constituent elements that are similar to those described in Embodiment 1 or 2 are given the same reference signs, and detailed descriptions thereof shall be omitted.

Figure 39:
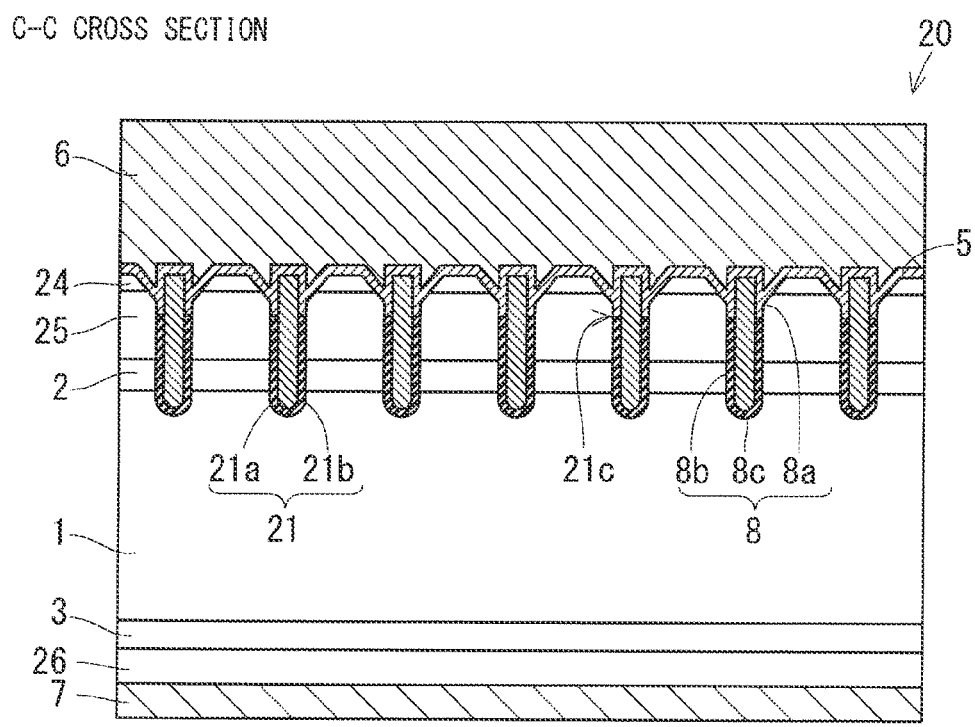
FIG. 39 is a sectional view illustrating a configuration of a diode area according to Embodiment 3.

FIG. 39 is a sectional view illustrating a configuration of one diode area 20 in the semiconductor device according to Embodiment 3. FIG. 39 is an illustration of a cross section taken along the line segment C-C illustrated in FIG. 6.

The upper side walls 8a of the trenches 8 have a gradient toward the outsides of the trenches 8. In other words, a mesa portion sandwiched between each two adjacent diode trench gates 21 has inclined surfaces. The inclined surfaces of the mesa portions are formed by etching the trench 8.

The barrier metal 5 also coverts the inclined surfaces. The inclination of the upper side walls 8a allows the barrier metal 5 to be deposited easily on the upper side walls 8a. The same also applies to the case where the emitter electrode 6, instead of the barrier metal 5, is formed directly on the upper side walls 8a.

Even this configuration can also achieve the same effects as those described in Embodiment 1.

Embodiment 4

A semiconductor device and a method of manufacturing a semiconductor device according to Embodiment 4 will be described. Embodiment 4 is a subordinate concept of Embodiment 1. In Embodiment 4, constituent elements that are similar to those described in any of Embodiments 1 to 4 are given the same reference signs, and detailed descriptions thereof shall be omitted.

Figure 40:
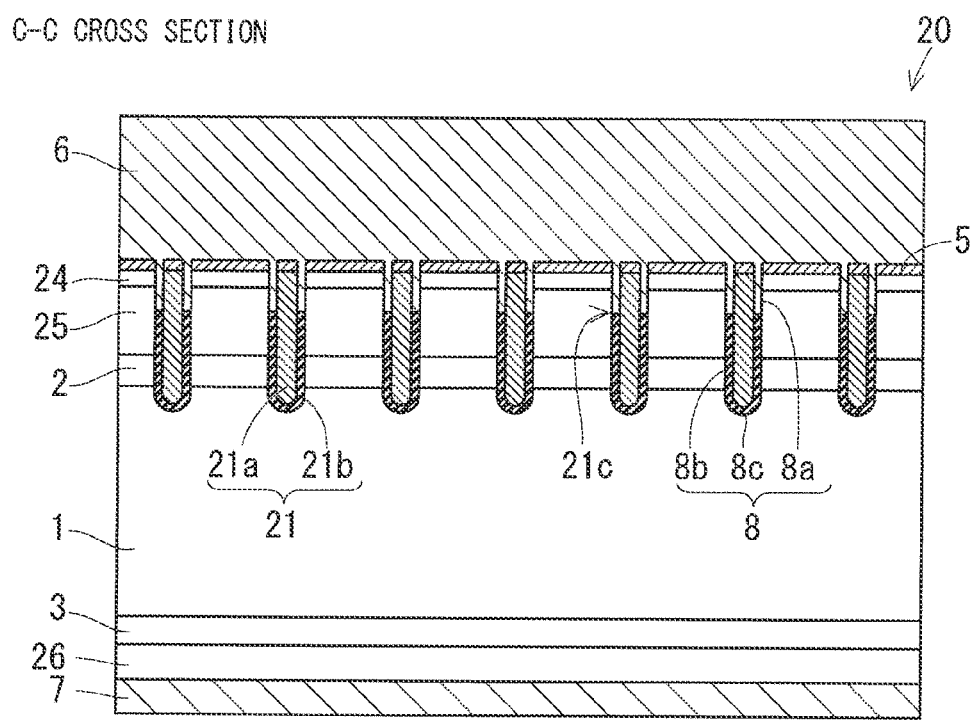
FIG. 40 is a sectional view illustrating a configuration of a diode area according to Embodiment 4.

FIG. 40 is a sectional view illustrating a configuration of one diode area 20 in the semiconductor device according to Embodiment 4. FIG. 40 is an illustration of a cross section taken along the line segment C-C illustrated in FIG. 6.

In the diode areas 20, the barrier metal 5 is provided on the p⁺-type contact layer 24 and on the upper surfaces of the diode trench electrodes 21a.

The emitter electrode 6 is provided on the barrier metal 5 and in the clearance between the upper side walls 8a of the trenches 8 and the side surfaces of the diode trench electrodes 21a. That is, the p-type anode layer 25 exposed from the upper side walls 8a is directly in ohmic contact with the emitter electrode 6. The emitter electrode 6 is also in contact with the side surfaces of the diode trench electrodes 21a. In other words, the barrier metal 5 is not provided in the clearance between the upper side walls 8a of the trenches 8 and the side surfaces of the diode trench electrodes 21a.

In the case where the emitter electrode 6 is formed of an aluminum alloy such as AlSi and the barrier metal 5 is formed of titanium-containing metal, the contact resistance between the emitter electrode 6 and the p-type anode layer 25 is lower than the contact resistance between the barrier metal 5 and the p-type anode layer 25. That is, an excellent ohmic contact is provided between the emitter electrode 6 and the p-type anode layer 25.

This configuration reduces the contact resistance of the upper side walls 8a of the trenches 8, in addition to the effect described in Embodiment 1.

While the invention has been shown and described in detail, the foregoing description is in all aspects illustrative and not restrictive. It is therefore to be understood that numerous modifications and variations can be devised without departing from the scope of the invention.

What is claimed is:

1. A semiconductor device comprising:
a semiconductor substrate;
a first semiconductor layer of a first conductivity type provided as a surface layer on an upper surface side of the semiconductor substrate;
a second semiconductor layer of a second conductivity type provided below the first semiconductor layer;
a diode trench gate that includes a diode trench insulation film and a diode trench electrode, the diode trench insulation film being formed on an inner wall of a trench that extends from an upper surface of the semiconductor substrate through the first semiconductor layer to the second semiconductor layer, the diode trench electrode being provided inside the trench; and
an electrode layer that covers the surface layer of the semiconductor substrate, wherein
the diode trench insulation film is formed along, out of the inner wall of the trench, a bottom and a lower side wall that is located below an upper side wall located on an upper end side of the trench,
the electrode layer further covers the upper side wall of the trench, and
the first semiconductor layer is in direct contact with the electrode layer on the upper side wall of the trench.

2. The semiconductor device according to claim 1, wherein
an upper end of the diode trench insulation film corresponds to a lower end of the upper side wall of the trench and is located above the second semiconductor layer.

3. The semiconductor device according to claim 2, wherein
a depth from the upper surface of the semiconductor substrate to the upper end of the diode trench insulation film is greater than or equal to 0.5 μm.

4. The semiconductor device according to claim 2, further comprising:
a contact layer of the first conductivity type provided on a surface side of the first semiconductor layer as the surface layer on the upper surface side of the semiconductor substrate, wherein
the trench of the diode trench gate penetrates through the contact layer, and
the upper end of the diode trench insulation film is located below the contact layer.

5. The semiconductor device according to claim 1, further comprising:
a contact layer of the first conductivity type selectively provided on a surface side of the first semiconductor layer as the surface layer on the upper surface side of the semiconductor substrate, wherein
a plurality of contact areas in which the contact layer is provided is surrounded by the first semiconductor layer in plan view, and
the diode trench gate is arranged between the plurality of contact areas in plan view so that the upper side wall of the trench penetrates through the first semiconductor layer located around the plurality of contact areas.

6. The semiconductor device according to claim 1, wherein
the upper side wall of the trench has a gradient toward outside the trench.

7. The semiconductor device according to claim 1, wherein
the electrode layer is formed of an aluminum alloy.

8. The semiconductor device according to claim 1, further comprising:
a diode area provided in the semiconductor substrate and in which a diode is formed, and
a transistor area provided adjacent to the diode area in the semiconductor substrate and in which an insulating gate bipolar transistor is formed, wherein
the diode includes the first semiconductor layer, the second semiconductor layer, and the diode trench gate, and
the diode and the insulating gate bipolar transistor form a reverse conducting IGBT.

* * * * *